(12) United States Patent
Takamiya

(10) Patent No.: US 7,081,330 B2
(45) Date of Patent: Jul. 25, 2006

(54) METHOD OF MAKING LITHOGRAPHIC PRINTING PLATE

(75) Inventor: Shuichi Takamiya, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 63 days.

(21) Appl. No.: 10/663,846

(22) Filed: Sep. 17, 2003

(65) Prior Publication Data
US 2004/0063036 A1 Apr. 1, 2004

(30) Foreign Application Priority Data
Sep. 20, 2002 (JP) ............................. 2002-275050
Sep. 20, 2002 (JP) ............................. 2002-275052

(51) Int. Cl.
*G03F 7/26* (2006.01)
*G03F 7/32* (2006.01)

(52) U.S. Cl. ................ 430/302; 430/270.1; 430/271.1; 430/309; 430/434; 430/435; 430/493; 430/494; 430/944; 430/945

(58) Field of Classification Search ............ 430/270.1, 430/271.1, 302, 309, 348, 434, 435, 494, 430/944, 945
See application file for complete search history.

(56) References Cited

U.S. PATENT DOCUMENTS 6,040,113 A 3/2000 Van Damme et al.
6,340,815 B1 * 1/2002 Verschueren et al. ........ 250/318
2003/0194653 A1 * 10/2003 Takamiya ..................... 430/302
2004/0131966 A1 * 7/2004 Oda ........................... 430/270.1

FOREIGN PATENT DOCUMENTS

| EP | 0 864 420 A1 | | 9/1998 |
|---|---|---|---|
| EP | 1 182 512 A1 | | 2/2002 |
| EP | 1211065 | * | 6/2002 |
| JP | 10-250255 | | 9/1998 |
| JP | 2000-321788 | | 11/2000 |
| JP | 2000321788 | * | 11/2000 |
| JP | 2001-166477 | | 6/2001 |
| JP | 2002-107954 | | 4/2002 |

* cited by examiner

*Primary Examiner*—Thorl Chea
(74) *Attorney, Agent, or Firm*—Buchanan Ingersoll PC

(57) ABSTRACT

A method of making a printing plate from a heat-sensitive PS plate of a positive-working mode for lithographic printing includes the steps of exposing the heat-sensitive PS plate to light and developing the PS plate using an alkaline developing solution containing at least one compound selected from the group consisting of cationic surfactants and compounds having three or more of an ethylene oxide-terminal group in the molecule thereof. The PS plate has a substrate and an image forming layer formed thereon, said image forming layer comprising a lower layer which is formed on the substrate and contains a water-insoluble and alkali-soluble resin and an upper heat-sensitive layer which is overlaid on the lower layer and contains a water-insoluble and alkali-soluble resin and an infrared absorption dye and exhibits an elevated solubility with respect to alkaline aqueous solutions when heated.

15 Claims, No Drawings

METHOD OF MAKING LITHOGRAPHIC PRINTING PLATE

FIELD OF THE INVENTION

The present invention relates to a method of making a printing plate from a heat-sensitive pre-sensitized plate for lithographic printing, which will be possibly hereinafter referred to as a PS plate for lithographic printing, capable of achieving direct plate making, that is, making a printing plate directly by exposing the PS plate to infrared laser scanning based on digital signals from computers or the like.

BACKGROUND OF THE INVENTION

There have been great strides made in the study of laser in recent years. In particular, solid lasers and semiconductor lasers that can emit light of wavelengths ranging from the near infrared region to the infrared region are available in the form of high-powered, small-sized laser devices. Such laser devices are remarkably useful as the light sources for light exposure when printing plates are made by direct transfer of digital data from computers or the like to image recording materials.

An image recording material for use in the PS plate of a positive-working mode for lithographic printing used with infrared laser comprises as the essential components a binder resin soluble in alkaline aqueous solutions and an infrared absorption dye, which will be hereinafter referred to as an IR dye, capable of absorbing infrared laser beam to emit heat. At a non-light exposed portion (which will serve as an image portion) in the image recording material, the IR dye serves to inhibit the binder resin from substantially dissolving in an alkaline developing solution as a result of the interaction between the IR dye and the binder resin. At a light exposed portion (which will become a non-image portion), on the other hand, the interaction between the IR dye and the binder resin is diminished by heat generated, which allows the light exposed portion to dissolve in the alkaline developing solution. Thus, a printing plate for lithographic printing can be formed.

However, the above-mentioned PS plate of a positive-working mode for lithographic printing used with infrared laser has the shortcoming that development is so subject to variations of operating conditions that the degree of development can become excessive or insufficient. This problem is caused because the difference between the force that can stop the image recording material from dissolving in the developing solution at the non-light exposed portion (image portion) and the solubility of the image recording material in the developing solution at the light exposed portion (non-image portion) is considered to be still insufficient in light of a variety of operating conditions. Another problem is that the difference between the light exposed portion and the non-exposed portion in the image recording layer of the PS plate becomes attenuated around the area in close proximity of a substrate of the PS plate, which results in poor reproduction of highlight portions. More specifically, the image forming performance of the PS plate for lithographic printing depends upon the heat generated when the surface of the image recording layer of the PS plate is exposed to the infrared laser. The heat conducting through the image recording layer is unfavorably diffused around the area adjacent to the substrate of the PS plate, where the thermal energy used for image formation, that is, used for making the image recording layer soluble in the developing solution is lowered.

No problem has been generated about the latitude for development in the conventional image recording materials for use in the PS plate of a positive-working mode for lithographic printing capable of forming a printing plate through the exposure to UV light. One example of such conventional image recording materials comprises a binder resin that is soluble in alkaline aqueous solutions and an onium salt, quinonediazide compound or the like. In the non-light exposed portion serving as an image portion, the onium salt or quinonediazide compound causes the interaction with the binder resin to inhibit the corresponding portion from dissolving in the developing solution. In the light exposed portion (non-image portion), the onium salt or quinonediazide compound is decomposed by the application of light thereto to generate an acid, which helps to dissolve the image recording material of the light exposed portion in the developing solution. In this case, however, the problem about the reproduction of highlight portions is also generated because of disturbance of light while the UV exposure is imagewise carried out via a lith type film.

In the case of the image recording materials for the PS plate of a positive-working mode for lithographic printing used with infrared laser, an infrared absorption agent or the like does not help to dissolve the alkali-soluble polymer in the developing solution at the light exposed portion, but just works to inhibit the alkali-soluble polymer from dissolving in the developing solution at the non-light exposed portion. Therefore, it is inevitable to use a binder resin that can originally show high solubility with respect to the alkaline developing solution in order to generate a significant difference between the solubility of the non-light exposed portion and that of the light exposed portion in the alkaline developing solution. This will cause the problems that the scratch resistance is lowered and the image recording material for use in the image recording layer becomes unstable before the initiation of development.

In order to form a highly sharp and clear image in a printing plate, there have been proposed an alkaline developing solution comprising a cationic surfactant, for use in processing an infrared radiation-presensitized plate for lithographic printing plate, as disclosed in JP KOKAI No. 2002-107954 ("JP KOKAI" herein means a publication of Japanese patent application), and an alkaline developing solution comprising an ethylene oxide adduct that has a specific group, the alkaline developing solution having a specific molar ratio of a potassium ion to total of alkali metal cation and ammonium, as disclosed in JP KOKAI No. 2000-321788. To solve the above-mentioned problems, it has been also proposed to provide a PS plate with a multi-layered image recording layer, which comprises an upper heat-sensitive layer of which the solubility in the developing solution can drastically change at the time of image formation, and a lower layer that is characterized by high solubility in alkaline solutions, as disclosed in JP KOKAI No. Hei 10-250255. In addition, as disclosed in JP KOKAI No. 2001-166477, it is proposed to provide an overcoating layer on an image recording layer in the PS plate of a positive-working mode. In this case, the image recording layer comprises a polymer that is soluble in the alkaline developing solution and a near infrared absorption dye, and the overcoating layer formed on the image recording layer is a near infrared-sensitive layer that shows higher alkali resistance than the image recording layer. However, the thermal efficiency at the light exposed portion is still low because of absorption of heat by the substrate such as an aluminum plate, so that the resultant solubility of the light exposed portion in the alkaline developing solution is not satisfactory at the step of development. Then, it is required to ensure the sufficient solubility of the light exposed portion of the image recording material in the developing solution by increasing the alkali content in the developing solution.

Even though the image recording layer having a laminated structure as mentioned above is employed for the PS plate, the force to prevent the image recording material at the non-light exposed portion from dissolving in the alkaline developing solution is still insufficient in the case where the alkali content of the developing solution is elevated. If there exists even a slight scratch on the surface of the image recording material at the non-light exposed portion, the image recording material will easily be dissolved in the developing solution, thereby causing a defective image. The above-mentioned problem has not yet been solved.

When consideration is given to the above, there is a limit to the alkali content in the developing solution even though the increase of alkali content in the developing solution is intended to clear the image recording material off the PS plate at the light exposed portion (non-image portion). It has been considered difficult to form sharp images with high contrast without damaging the formed image portion. Therefore, in order to form image portions with higher contrast and sharpness in the PS plate having such a multi-layered image recording layer as mentioned above without damaging the formed image portion, improvements should be proposed from the aspect of the alkaline developing solution that is used to develop the PS plate.

SUMMARY OF THE INVENTION

An object of the present invention is to provide a method of directly making a lithographic printing plate wherein a highly sharp and clear image can be formed without damages to the formed image areas, from a heat-sensitive PS plate of a positive-working mode for lithographic printing, in particular, from a heat-sensitive PS plate of a positive-working mode comprising an image forming layer with a laminated structure.

The inventor of the present invention has intensively studied to achieve the above-mentioned object. As a result, it has been found that in processing a heat-sensitive PS plate of a positive-working mode for lithographic printing comprising an image forming layer with a laminated structure, the use of a specific surfactant in a developing solution can achieve sufficient dissolution of light-exposed area in the PS plate and highly sharp image formation without damages to the image area. The present invention has been thus accomplished.

Accordingly, the present invention provides a method of making a lithographic printing plate from a heat-sensitive pre-sensitized plate of a positive-working mode for lithographic printing comprising the steps of:

exposing the heat-sensitive pre-sensitized plate to light, and developing the plate using an alkaline developing solution comprising at least one compound selected from the group consisting of cationic surfactants and compounds having three or more of an ethylene oxide-terminal group in the molecule thereof, wherein the pre-sensitized plate comprises a substrate, a lower layer which comprises a water-insoluble and alkali-soluble resin, and an upper heat-sensitive layer which comprises a water-insoluble and alkali-soluble resin and an infrared absorption dye and exhibits an elevated solubility with respect to alkaline aqueous solutions when heated, said lower layer and said upper heat-sensitive layer being located on the substrate in this order.

The PS plate for use in the present invention comprises more specifically, a substrate for lithographic printing plate and an image forming layer on the substrate, said image forming layer comprising the lower layer and the upper heat-sensitive layer located on the lower layer.

DETAILED DESCRIPTION OF THE INVENTION

The alkaline developing solution for use in the present invention, which will also be hereinafter referred to as the developing solution simply, will now be explained in detail.

The developing solution for use in the present invention is an alkaline aqueous solution, which can appropriately be chosen from the conventional alkaline aqueous solutions.

The developing solutions for use in the present invention include an alkaline aqueous solution comprising an alkali silicate or a nonreducing sugar and a base. The alkaline developing solutions having a pH range from 12.5 to 14.0 are particularly preferable.

The above-mentioned alkali silicate shows alkaline properties when dissolved in water. For example, silicates of alkali metals such as sodium silicate, potassium silicate and lithium silicate, and ammonium silicate can be used. Such alkali silicates may be used alone or in combination.

The development performance of the alkaline aqueous solution comprising the above-mentioned alkali silicate can easily be controlled by adjusting the mixing ratio of the components constituting the silicate, that is, silicon dioxide ($SiO_2$) and alkali oxide represented by $M_2O$, wherein M is an alkali metal or ammonium group, and the concentration of the alkali silicate.

In the above-mentioned alkaline aqueous solution, it is preferable that the molar ratio of the silicon dioxide ($SiO_2$) to the alkali oxide ($M_2O$) be in the range of 0.5 to 3.0 from the aspect of moderate alkalinity and developing performance, and more preferably 1.0 to 2.0.

The concentration of the alkali silicate in the developing solution is preferably in the range of 1 to 10% by weight from the aspect of developing performance and processing ability, more preferably 3 to 8% by weight, and most preferably 4 to 7% by weight, with respect to the total weight of the alkaline aqueous solution.

In the developing solution comprising a nonreducing sugar and a base, the nonreducing sugars mean sugars having no reducing properties due to the absence of free aldehyde group and ketone group. The nonreducing sugars are classified into trehalose type oligosaccharides prepared by linking reducing groups together, glycosides prepared by joining a reducing group of sugars with non-sugars, and sugar alcohols prepared by reducing sugars with hydrogenation. Any of the above-mentioned nonreducing sugars can preferably be used in the present invention.

The trehalose type oligosaccharides include, for example, saccharose and trehalose; and the glycosides include, for example, alkyl glycoside, phenol glycoside, and mustard oil glycoside.

Examples of the sugar alcohols are D, L-arabitol, ribitol, xylitol, D, L-sorbitol, D, L-mannitol, D, L-iditol, D, L-talitol, meso-inositol, dulcitol, and allodulcitol. Further, maltitol obtained by subjecting disaccharides to hydrogenation and reductants (e.g., reduced starch syrup) obtained by subjecting oligosaccharides to hydrogenation are also preferred.

Among the above-mentioned nonreducing sugars, trehalose type oligosaccharides and sugar alcohols, in particular, saccharose, D-sorbitol, meso-inositol and reduced starch syrup are preferably employed because there can be obtained a buffering action to lead to an adequate pH range.

Those nonreducing sugars may be used alone or in combination. The amount of the nonreducing sugar in the developing solution is preferably in the range of 0.1 to 30% by weight, more preferably 1 to 20% by weight.

The above-mentioned alkali silicate or nonreducing sugar can be used in combination with a base, which may appropriately be selected from the conventional alkaline chemicals, and a pH value of the developing solution can be adjusted.

Examples of the alkaline chemicals include sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like.

In addition to the above, organic alkaline chemicals such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine can also be used.

Those alkaline chemicals may be used alone or in combination.

Among the above-mentioned alkaline chemicals which are suitable are sodium hydroxide and potassium hydroxide. By controlling the amount of the alkaline chemicals such as sodium hydroxide and potassium hydroxide with respect to the nonreducing sugar, the pH value of the developing solution can be determined within a wide range. Further, sodium tertiary phosphate, potassium tertiary phosphate, sodium carbonate and potassium carbonate are also preferable, since they have themselves, buffering action.

The developing solution for use in the present invention comprises at least one compound selected from the group consisting of cationic surfactants and compounds having three or more of an ethylene oxide-terminal group in the molecule thereof. The developing solution for use in the present invention may comprise any one compound selected from the above group. The developing solution may also comprise any combination of two or more compounds selected from the above group, for example, two or more compounds selected from cationic surfactants; two or more compounds selected from compounds having three or more of an ethylene oxide-terminal group in the molecule thereof; or at least one from cationic surfactants and at least one from compounds having three or more of an ethylene oxide-terminal group in the molecule thereof.

[Cationic Surfactant]

The cationic surfactants for use in the developing solution include amine salts, quaternary ammonium salts, phosphonium salts and sulfonium salts. The amine salts specifically include primary amine salts including those represented by the following formula (1), secondary amine salt including those represented by the following formula (2), tertiary amine salts including those represented by the following formula (3), modified amine salts including those represented by the following formulas (4)–(6), and imidazoline type-amine salts including those represented by the following formula (7).

The quaternary ammonium salts specifically include tetraalkyl quaternary ammonium salts including those represented by the following formula (8), modified trialkyl quaternary ammonium salts including those represented by the following formulas (9)–(11), trialkyl benzyl quaternary ammonium salts including those represented by the following formula (12), modified trialkyl benzyl quaternary ammonium salts including those represented by the following formulas (13)–(15), alkylpyridinium salts including those represented by the following formula (16), modified alkylpyridinium salts including those represented by the following formulas (17)–(19), alkylquinolinium salts including those represented by the following formula (20), imidazolinium salts including those represented by the following formula (21), and benzimidazolinium salts including those represented by the following formula (22).

The phosphonium salts include alkylphosphonium salts represented by the following formula (23). The sulfonium salts include alkylsulfonium salts represented by the following formula (24).

Examples of counter anion in the salts are various acid radical ion, acidic ester ion such as $R\text{—}O\text{—}SO_3^-$, halogen ion, hydroxide ion and the like.

(1)

(2)

(3)

(4)

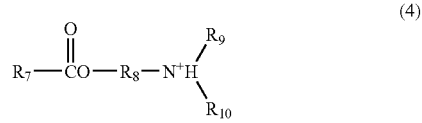

(5)

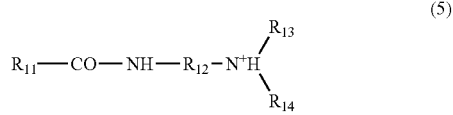

(6)

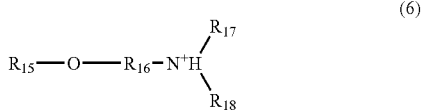

(7)

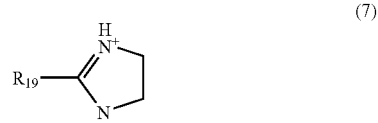

(8)

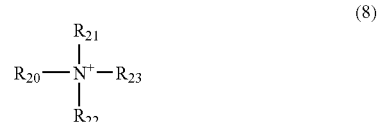

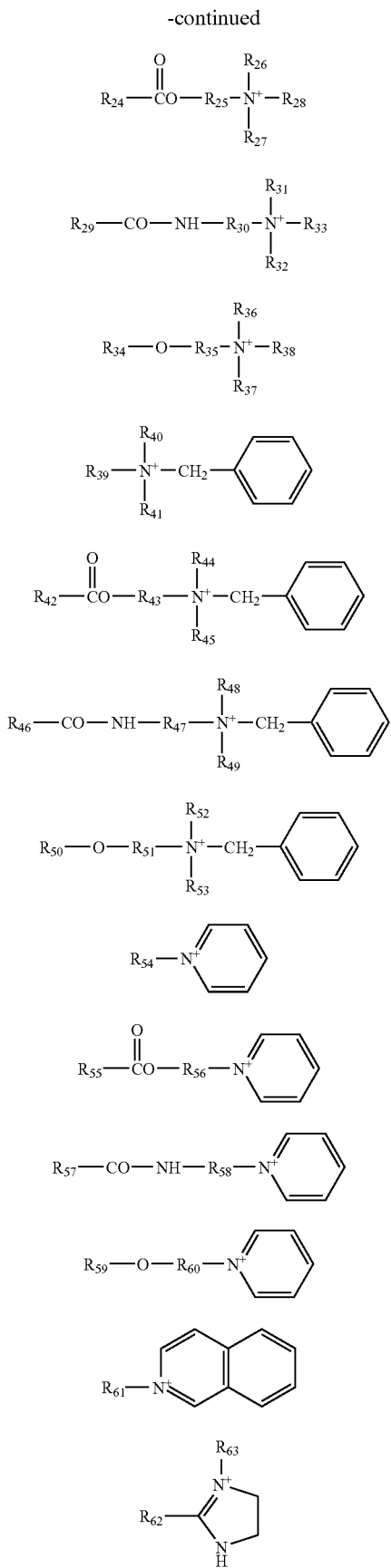
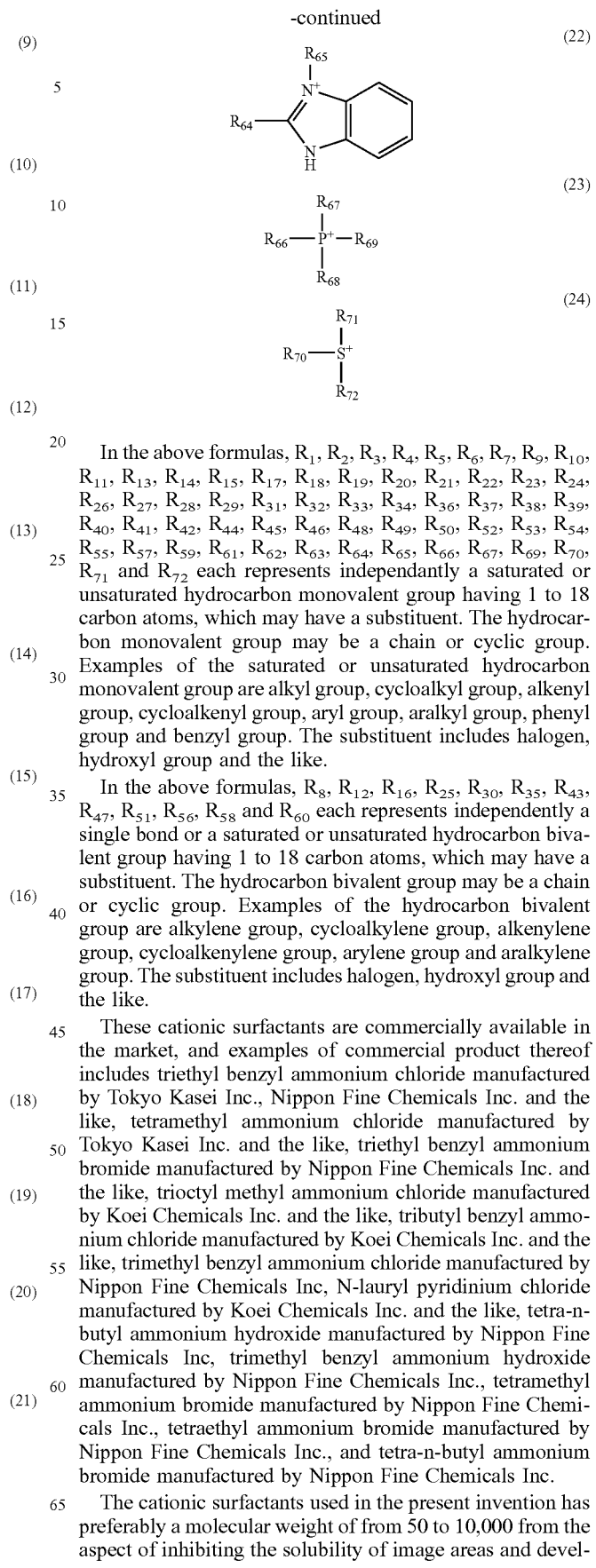

In the above formulas, $R_1$, $R_2$, $R_3$, $R_4$, $R_5$, $R_6$, $R_7$, $R_9$, $R_{10}$, $R_{11}$, $R_{13}$, $R_{14}$, $R_{15}$, $R_{17}$, $R_{18}$, $R_{19}$, $R_{20}$, $R_{21}$, $R_{22}$, $R_{23}$, $R_{24}$, $R_{26}$, $R_{27}$, $R_{28}$, $R_{29}$, $R_{31}$, $R_{32}$, $R_{33}$, $R_{34}$, $R_{36}$, $R_{37}$, $R_{38}$, $R_{39}$, $R_{40}$, $R_{41}$, $R_{42}$, $R_{44}$, $R_{45}$, $R_{46}$, $R_{48}$, $R_{49}$, $R_{50}$, $R_{52}$, $R_{53}$, $R_{54}$, $R_{55}$, $R_{57}$, $R_{59}$, $R_{61}$, $R_{62}$, $R_{63}$, $R_{64}$, $R_{65}$, $R_{66}$, $R_{67}$, $R_{69}$, $R_{70}$, $R_{71}$ and $R_{72}$ each represents independantly a saturated or unsaturated hydrocarbon monovalent group having 1 to 18 carbon atoms, which may have a substituent. The hydrocarbon monovalent group may be a chain or cyclic group. Examples of the saturated or unsaturated hydrocarbon monovalent group are alkyl group, cycloalkyl group, alkenyl group, cycloalkenyl group, aryl group, aralkyl group, phenyl group and benzyl group. The substituent includes halogen, hydroxyl group and the like.

In the above formulas, $R_8$, $R_{12}$, $R_{16}$, $R_{25}$, $R_{30}$, $R_{35}$, $R_{43}$, $R_{47}$, $R_{51}$, $R_{56}$, $R_{58}$ and $R_{60}$ each represents independently a single bond or a saturated or unsaturated hydrocarbon bivalent group having 1 to 18 carbon atoms, which may have a substituent. The hydrocarbon bivalent group may be a chain or cyclic group. Examples of the hydrocarbon bivalent group are alkylene group, cycloalkylene group, alkenylene group, cycloalkenylene group, arylene group and aralkylene group. The substituent includes halogen, hydroxyl group and the like.

These cationic surfactants are commercially available in the market, and examples of commercial product thereof includes triethyl benzyl ammonium chloride manufactured by Tokyo Kasei Inc., Nippon Fine Chemicals Inc. and the like, tetramethyl ammonium chloride manufactured by Tokyo Kasei Inc. and the like, triethyl benzyl ammonium bromide manufactured by Nippon Fine Chemicals Inc. and the like, trioctyl methyl ammonium chloride manufactured by Koei Chemicals Inc. and the like, tributyl benzyl ammonium chloride manufactured by Koei Chemicals Inc. and the like, trimethyl benzyl ammonium chloride manufactured by Nippon Fine Chemicals Inc, N-lauryl pyridinium chloride manufactured by Koei Chemicals Inc. and the like, tetra-n-butyl ammonium hydroxide manufactured by Nippon Fine Chemicals Inc, trimethyl benzyl ammonium hydroxide manufactured by Nippon Fine Chemicals Inc., tetramethyl ammonium bromide manufactured by Nippon Fine Chemicals Inc., tetraethyl ammonium bromide manufactured by Nippon Fine Chemicals Inc., and tetra-n-butyl ammonium bromide manufactured by Nippon Fine Chemicals Inc.

The cationic surfactants used in the present invention has preferably a molecular weight of from 50 to 10,000 from the aspect of inhibiting the solubility of image areas and developing ability, more preferably from 100 to 5,000, and most preferably from 500 to 3,500.

The amount of the cationic surfactant in the developing solution ranges generally from 0.001 to 10% by weight from the aspect of inhibiting adequately the solubility of image areas, preferably from 0.05 to 5% by weight, and more preferably from 0.1 to 3% by weight.

[Compound Having Three or More of Ethylene Oxide-terminal Group in Molecule Thereof]

The compound having three or more of an ethylene oxide-terminal group in the molecule thereof used in the present invention includes the compound having three or more of an ethylene oxide-terminal group represented by the formula: $-(CH_2CH_2O)zH$ (wherein z is an integer of 1 or more) in the molecule thereof, which may be called a branched ethylene oxide adduct. Hereinafter, the compound having three or more of an ethylene oxide-terminal group in the molecule thereof is possibly referred to as an ethylene oxide adduct. The ethylene oxide adduct for use in the present invention excludes polyethylene glycol.

The ethylene oxide adduct used in the present invention has in the molecular structure, at least one group of the following formula (I) or (II):

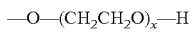  (I)

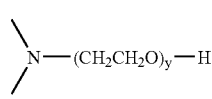  (II)

wherein x and y each represents an integer of 1 to 100, preferably an integer of 1 to 50, and more preferably an integer of 1 to 30.

In case that the ethylene oxide group ($CH_2CH_2O$: hereinafter referred to as "EO" for short) is combined with a nitrogen atom, as represented by the above formula (II), two or more of ethylene oxide-terminal groups may be combined with an identical nitrogen atom in the molecule, and such compound is one of suitable compounds for use in the present invention.

The ethylene oxide adduct used in the present invention has generally three or more of an ethylene oxide-terminal group, specifically, no fewer than three and nor more than 20, preferably nor more than 10, and more preferably nor more than 6 of an ethylene oxide-terminal group. Examples of the ethylene oxide adduct used in the invention includes the following (A)–(F) compounds wherein the symbols of a to w each represents an integer of 1 to 100, preferably an integer of 1 to 50, and more preferably an integer of 1 to 30, but the present invention is not limited these compounds.

(A) triethanolamine EO adduct
(B) trimethylolpropyl ether EO adduct
(C) ethylenediamine EO adduct
(D) diglyceryl ether EO adduct
(E) glycerol EO adduct
(F) sorbitol EO adduct

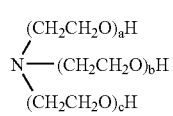  (A)

-continued

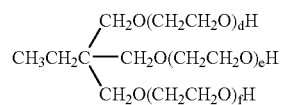  (B)

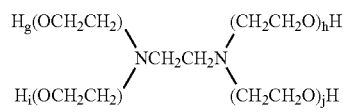  (C)

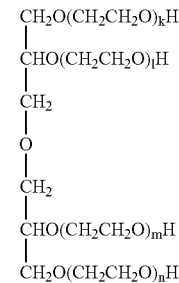  (D)

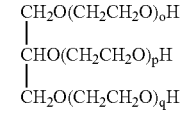  (E)

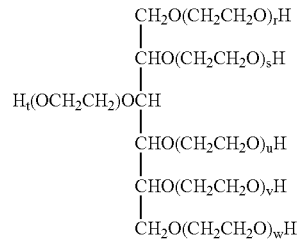  (F)

Among these, in the light of inhibiting sufficiently the solubility of the image areas, the compound having the group represented by the above formula (I), the compound (F), i.e., a sorbitol EO adduct is preferably used.

The ethylene oxide adduct used in the present invention has preferably a molecular weight of from 500 to 5,000 from the aspect of inhibiting the solubility of image areas and developing ability, more preferably from 1000 to 4,000, and most preferably from 2000 to 3,500.

It is possible to select the integer of no fewer than 1 represented by x and y in the formulas (I) and (II), and a to w in the above (A) to (F) compounds so that the ethylene oxide adduct used may have a molecular weight within the above range.

The amount of the ethylene oxide adduct in the developing solution ranges generally from 0.001 to 10% by weight from the aspect of inhibiting adequately the solubility of image areas, and preferably from 0.05 to 5% by weight.

When the cationic surfactant and the ethylene oxide adduct are used in combination, the amount of these compounds in the developing solution in total is suitably from 0.002 to 20.0% by weight, and preferably from 0.10 to 10.0% by weight.

The use of the cationic surfactant and/or the ethylene oxide adduct in a developing solution is capable of forming an edge-form, highly sharp and clear image without impairment to the formed image areas caused by dissolution of the image, even if a highly alkali-soluble high molecular weight compound is employed in an image forming layer or an alkalinity of the developing solution is elevated. Thus the use of the above component in a developing solution is capable of reproducing sharply fine images such as dot patterns, fine lines and the like.

The developing solution for use in the present invention may further comprise various additives as shown below in order to enhance the development performance more effectively.

The additives include, for example, a chelating agent such as EDTA and NTA as disclosed in JP KOKAI No. Sho 58-190952; a complex such as $[Co(NH_3)_6]Cl_3$ and $CoCl_2.6H_2O$ as disclosed in JP KOKAI No. Sho 59-121336; a nonionic surfactant such as tetramethyldecyne diol as disclosed in U.S. Pat. No. 4,374,920; a cationic polymer such as methyl chloride quaternary compounds of p-dimethylaminomethyl polystyrene as disclosed in JP KOKAI No. Sho 55-95946; a polymeric ampholyte such as a copolymer of vinylbenzyltrimethylammonium chloride and sodium acrylate as disclosed in JP KOKAI No. Sho 56-142528; a reducing inorganic salt such as sodium sulfite as disclosed in JP KOKAI No. Sho 57-192951; an organic metal containing surfactant such as surfactants containing organic silicon or titanium as disclosed in JP KOKAI No. Sho 59-75255; an organic boron compound as disclosed in JP KOKAI No. Sho 59-84241; and a quaternary ammonium salt such as tetraalkylammonium oxide as disclosed in EP 101,010.

Preferably, the developing solution for use in the present invention may have a surface tension of 65 dyne/cm or less, more preferably 60 dyne/cm or less. The surface tension of the developing solution can be measured, for example, by the oscillating jet method. The instrument for measuring the surface tension includes an automatic dynamic surface tension meter of oscillating jet type.

The embodiment where the alkaline developing solution for use in the present invention is employed is not particularly limited. To rationalize and standardize the process of making a printing plate in the fields of plate making and printing, automatic processors have widely been used to produce printing plates in recent years. Typically, the automatic processor comprises a development unit and a post-treatment unit, including an apparatus for transporting a PS plate, containers for various kinds of treatment liquids, and apparatuses for spraying the liquids onto the PS plate. While the PS plate that has been exposed to light image is horizontally transported in the automatic processor, each treatment liquid is drawn up from the container using a pump and sprayed onto the PS plate through the spray nozzle, thereby achieving the development. There is also known a method of treating the PS plate by immersing the PS plate in a treatment liquid held in the container while transporting the PS plate along a guide roll provided in the container.

Such an automatic processor can achieve continuous development operation by replenishing the treatment liquids in respective containers according to the amount consumed and the operating time. In this case, large quantities of PS plates can be treated without any replacement of the developing solution in a developer container over a long period of time by adding to the developing solution a replenisher controlled to have an alkalinity higher than that of the developing solution. In the embodiments where the alkaline developing solution for use in the present invention is employed, the above-mentioned replenishing system is preferably used. Basically, the replenisher may have the same formulation as that of the alkaline developing solution mentioned above.

The aforementioned developing solution and replenisher therefor may further comprise other surfactants than those mentioned above and organic solvents, if necessary, in order to appropriately control the developing performance, enhance the dispersion properties of sludge in the developing solution, and increase the ink receptivity of the image portion to be formed in the printing plate. Benzyl alcohol or the like is preferred as the above-mentioned organic solvent. In addition, it is also preferable to add polyethylene glycol or derivatives thereof, and polypropylene glycol or derivatives thereof.

Furthermore, when necessary, the developing solution and replenisher may comprise hydroquinone, resorcin, an inorganic salt type reducing agent such as sodium sulfite or hydrogensulfite and potassium sulfite, or hydrogensulfite, an organic carboxylic acid, an antifoaming agent, and a water softener.

Not only the above-mentioned development process, but also the development process using only a substantially fresh developing solution, that is, a throwaway developing solution, can be applied to the method of making a printing plate according to the present invention.

The PS plate for lithographic printing which has finished the development treatment using the above-mentioned alkaline developing solution is then subjected to the post-treatment. The PS plate is subjected to the post-treatment with washing water, a rinsing solution containing a surfactant, and a desensitizing solution comprising gum arabic and starch derivatives. Such liquids as conventionally known can be used in combination in the post-treatment.

The heat-sensitive PS plate of a positive-working mode for lithographic printing for use in the present invention, and the components constituting the PS plate will now be explained in detail.

The PS plate for lithographic printing that is used for the plate making method of the present invention comprises a substrate and a heat-sensitive image forming layer formed on the substrate, the heat-sensitive image forming layer comprising a lower layer and a heat-sensitive upper layer which are successively overlaid on the substrate in this order, wherein the lower layer comprises a water-insoluble and alkali-soluble resin and the heat-sensitive upper layer comprises a water-insoluble and alkali-soluble resin and an infrared absorption dye and exhibits an elevated solubility with respect to alkaline aqueous solutions when heated. Namely, the heat-sensitive upper layer comprising an alkali-soluble resin and an infrared absorption dye is disposed at the surface portion that is subjected to light exposure, and the lower layer comprising an alkali-soluble resin is disposed at a portion adjacent to the substrate. Examples of such a PS plate having a multi-layered heat-sensitive image forming layer are disclosed in JP KOKAI No. 2001-166477 and JP Patent Application No. 2002-194657.

[Alkali-soluble Resin]

In the present invention, the water-insoluble and alkali-soluble resin contained in the heat-sensitive upper layer and the lower layer means a polymeric compound that is insoluble in water and soluble in alkaline solutions, which will also be referred to as an alkali-soluble polymer hereinafter. The alkali-soluble polymer includes homopolymers having an acidic group in the main chain and/or side chain thereof, and copolymers or mixtures thereof Therefore, one of the features of the upper heat-sensitive layer and the lower layer is that those layers are dissolved in the alkaline developing solution when come in contact therewith.

Any conventional alkali-soluble polymers can be used in the present invention. It is preferable that the employed polymers have in the molecule thereof at least one functional group selected from the group consisting of: (1) phenolic hydroxyl group, (2) sulfonamide group, and (3) active imide group.

The following polymers can be given as examples, but the alkali-soluble polymer for use in the present invention is not limited to the following examples.

(1) Examples of the alkali-soluble polymers having a phenolic hydroxyl group are as follows: novolak resins such as phenol—formaldehyde resin, m-cresol—formaldehyde resin, p-cresol—formaldehyde resin, (mixture of m-cresol and p-cresol)—formaldehyde resin, and mixture of phenol and cresol (m-cresol and/or p-cresol)—formaldehyde resin; and pyrogallolacetone resins. In addition to the above alkali-soluble polymers having a phenolic hydroxyl group, polymers having a phenolic hydroxyl group in the side chain thereof are preferably used. Such polymers having a phenolic hydroxyl group in the side chain thereof can be obtained by homopolymerization of a polymerizable monomer which is composed of a low-molecular compound comprising at least one phenolic hydroxyl group and at least one polymerizable unsaturated bond, or copolymerization of the above-mentioned monomer with other polymerizable monomers.

Examples of the polymerizable monomer having a phenolic hydroxyl group used to obtain the polymers having a phenolic hydroxyl group in the side chain thereof include phenolic hydroxyl group-containing acrylamide, methacrylamide, acrylic ester, methacrylic ester, and hydroxystyrene. Specific examples of the above-mentioned polymerizable monomer include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate.

The above-mentioned phenolic hydroxyl group-containing resins may be used alone or in combination. Moreover, condensation polymers of phenol having as a substituent an alkyl group with 3 to 8 carbon atoms and formaldehyde, such as t-butylphenol—formaldehyde resin and octylphenol—formaldehyde resin may be. used together, as disclosed in U.S. Pat. No. 4,123,279.

(2) The alkali-soluble polymers having a sulfonamide group include polymers obtained by homopolymerization of a sulfonamide group-containing polymerizable monomer or copolymerization of the above polymerizable monomer and other polymerizable monomers. The sulfonamide group-containing polymerizable monomer is composed of a low-molecular compound having in one molecule thereof at least (i) one sulfonamide group (—NH—SO$_2$) wherein at least one hydrogen atom is bonded to nitrogen atom, and (ii) at least one polymerizable unsaturated bond. In particular, low-molecular compounds having acryloyl group, allyl group or vinyloxy group, and substituted- or monosubstituted-aminosulfonyl group or substituted-sulfonylimino group are preferably used.

(3) With respect to the active imide group-containing alkali-soluble polymers, polymers having an active imide group in the molecule thereof are preferable. Such polymers can be obtained by homopolymerization of a polymerizable monomer which is composed of a low-molecular compound having in the molecule thereof one or more active imide groups and one or more polymerizable unsaturated bonds, or copolymerization of the above-mentioned monomer with other polymerizable monomers.

Preferable examples of the active imide group-containing polymers are N-(p-toluenesulfonyl)methacrylamide and N-(p-toluenesulfonyl)acrylamide.

Moreover, preferably employed are polymers obtained by polymerizing two or more polymerizable monomers selected from the group consisting of the above-mentioned phenol group-containing polymerizable monomers, sulfonamide group-containing polymerizable monomers, and active imide group-containing polymerizable monomers, and polymers obtained by subjecting the above-mentioned two or more polymerizable monomers to copolymerization with other polymerizable monomers.

In the case where the phenol group-containing polymerizable monomer (M1) is subjected to copolymerization with the sulfonamide group-containing polymerizable monomer (M2) and/or the active imide group-containing polymerizable monomer (M3), the ratio by weight of M1 to M2 and/or M3 is preferably in the range of (50:50) to (5:95), more preferably in the range of (40:60) to (10:90).

In the case where the alkali-soluble polymer is a copolymer consisting of one monomer unit selected from the above-mentioned monomers having acidic groups such as (1) phenol group, (2) sulfonamide group, and (3) active imide group and another monomer unit of other polymerizable monomers, it is preferable that the former monomer unit be contained in an amount of 10 mol % or more from the aspect of obtaining sufficient alkali-solubility to expand development latitude, more preferably 20 mol % or more, in the obtained copolymer.

Conventionally known graft copolymerization method, block copolymerization method, random copolymerization method and the like can be employed for synthesis of the above-mentioned copolymers.

The monomer components that can be used for copolymerization with the above-mentioned polymerizable phenolic hydroxyl group-containing monomers, sulfonamide group-containing monomers, and active imide group-containing monomers are classified into the following groups (m1) to (m12). However, the monomer components are not limited to the following examples.

(m1): Acrylic esters and methacrylic esters having an aliphatic hydroxyl group, such as 2-hydroxyethyl acrylate and 2-hydroxyethyl methacrylate.

(m2): Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3): Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4): Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(m5): Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6): Vinyl esters such as vinyl acetate, vinyl chloroacetate, vinyl butyrate, and vinyl benzoate.

(m7): Styrenes such as styrene, α-methylstyrene, methylstyrene, and chloromethylstyrene.

(m8): Vinyl ketones such as methyl vinyl ketone, ethyl vinyl ketone, propyl vinyl ketone, and phenyl vinyl ketone.

(m9): Olefins such as ethylene, propylene, isobutylene, butadiene, and isoprene.

(m10): N-vinylpyrrolidone, acrylonitrile, and methacrylonitrile.

(m11): Unsaturated imides such as maleimide, N-acryloylacrylamide, N-acetylmethacrylamide, N-propionylmethacrylamide, and N-(p-chlorobenzoyl)methacrylamide.

(m12): Unsaturated carboxylic acids such as acrylic acid, methacrylic acid, maleic anhydride, and itaconic acid.

In the case where the alkali-soluble polymer for use in the present invention is a homopolymer of the above-mentioned phenolic hydroxyl group-containing polymerizable monomer, sulfonamide group-containing polymerizable monomer, or active imide group-containing polymerizable monomer, or a copolymer comprising the above-mentioned polymerizable monomer, the weight-average molecular weight (Mw) of the obtained polymer may be preferably 2,000 or more, more preferably in the range of 5,000 to 300,000, and the number-average molecular weight (Mn) of the obtained polymer may be preferably 500 or more, more preferably in the range of 800 to 250,000. The polydispersity (Mw/Mn) is desirably in the range of 1.1 to 10.

In the case where the alkali-soluble polymer is a resin such as phenol—formaldehyde resin, cresol—aldehyde resin or the like, the polymer with a weight-average molecular weight of 500 to 20,000 and a number-average molecular weight of 200 to 10,000 is preferably used.

Further, an alkali-soluble polymer having a carboxyl group (hereinafter referred to as (B1) component) can be used in combination with the above polymer, and preferred are the polymers (b1-1) and (b1-2) which are defined below.

(b1-1) Alkali-soluble polymer having a polymerizable monomer unit represented by the following general formula (III)

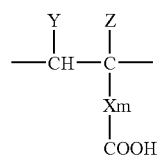

(III)

wherein Xm represents a single bond or a bivalent connecting group, Y represents hydrogen atom or a carboxyl group, and Z represents hydrogen atom, alkyl or carboxyl group.

A monomer constructing the monomer unit of the formula (III) includes a polymerizable monomer having at least one carboxyl group and at least one polymerizable unsaturated group in the molecule thereof. Specific examples of the polymerizable monomer are α,β-unsaturated carboxylic acids such as acrylic acid, methacrylic acid, maleic acid, maleic anhydride, itaconic acid, itaconic anhydride and the like.

A monomer which is copolymerized with the above polymerizable monomer having a carboxyl group includes those listed below as (1) to (11), but the present invention is not restricted to these specific ones at all:

(1) acrylic acid esters and methacrylic acid esters each carrying an aliphatic hydroxyl group such as 2-hydroxyethyl acrylate and 2-hydroxyethyl methacrylate;

(2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;

(3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;

(4) acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;

(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) vinyl esters such as vinyl acetate, vinyl chloroacetate, vinyl butyrate and vinyl benzoate;

(7) styrenes such as styrene, α-methyl styrene, methyl styrene and chloromethyl styrene;

(8) vinyl ketones such as methyl vinyl ketone, ethyl vinyl ketone, propyl vinyl ketone and phenyl vinyl ketone;

(9) olefins such as ethylene, propylene, isobutylene, butadiene and isoprene;

(10) N-vinyl pyrrolidone, N-vinyl carbazole, 4-vinyl pyridine, acrylonitrile, methacrylonitrile or the like;

(11) unsaturated imides such as maleimide, N-acryloyl acrylamide, N-acetyl methacrylamide, N-propionyl methacrylamide and N-(p-chlorobenzoyl) methacrylamide.

Alternatively, a monomer represented by the following general formula (IV) may be preferably used.

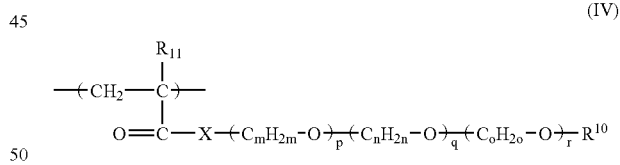

(IV)

wherein X represents O, S or N—$R^{12}$; $R^{10}$ to $R^{12}$ represent each independently hydrogen atom or an alkyl group; m, n and o represent each independently an integer of from 2 to 5; $C_mH_{2m}$, $C_nH_{2n}$ and $C_oH_{2o}$ are independently in the form of linear or branched chain; p, q and r represent each independently an integer of from 0 to 3,000, and $p+q+r \geq 2$.

The alkyl group represented by $R^{10}$ to $R^{12}$ is preferably an alkyl group having 1 to 12 carbon atoms, and specifically includes methyl, ethyl, n-propyl and isopropyl groups and the like. In the formula, p, q and r represent preferably an integer of from 0 to 500, and more preferably from 0 to 100.

Examples of monomers corresponding to the repeating unit represented by the formula (IV) are listed below, but the present invention is not restricted to these specific ones at all.

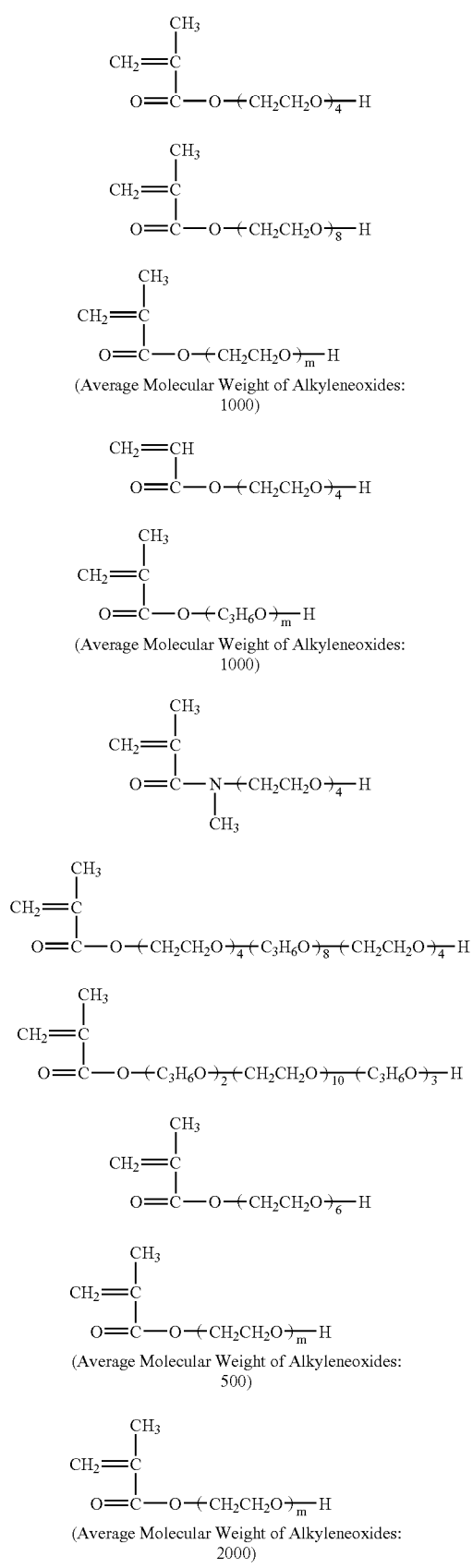

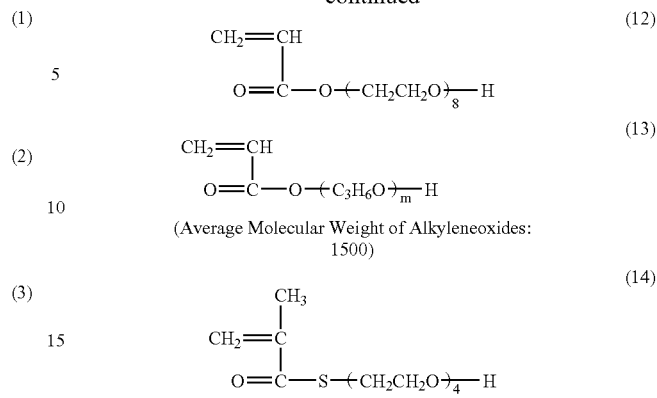

The repeating unit represented by the formula (IV) can be prepared by reacting a commercially available hydroxy poly(oxyalkylene) material such as Pluronic (trade name) manufactured by Asahi Dennka Kogyo Co., Ltd., AdekaPolyether (trade name) manufactured by Asahi Dennka Kogyo Co., Ltd., Carbowax (trade name) manufactured by Glyco Products, Toriton (trade name) manufactured by Rohm and Haas and P.E.G manufactured by Dai-ichi Kogyo Seiyaku Co., Ltd., with acrylic acid, methacrylic acid, acrylchloride, methacrylchloride, acrylic anhydride or the like in a well known method.

Alternatively, poly(oxyalkylene) diacrylate can be used, which is prepared by a well known method.

Commercially available monomers include a hydroxyl-terminated polyalkylene glycol mono(meth)acrylate manufactured by Nippon Yushi Co., Ltd. such as Blenmer PE-90, Blenmer PE-200, Blenmer PE-350, Blenmer AE-90, Blenmer AE-200, Blenmer AE-400, Blenmer PP-1000, Blenmer PP-500, Blenmer PP-800, Blenmer AP-150, Blenmer AP-400, Blenmer AP-550, Blenmer AP-800, Blenmer 50PEP-300, Blenmer 70PEP-350B, Blenmer AEP Series, Blenmer 55PET-400, Blenmer 30PET-800, Blenmer 55PET-800, Blenmer AET Series, Blenmer 30PPT-800, Blenmer 50PPT-800, Blenmer 70PPT-800, Blenmer APT Series, Blenmer 10PPB-500B, Blenmer 10APB-500B and the like. Similarly, there are an alkyl-terminated polyalkylene glycol mono(meth)acrylate manufactured by Nippon Yushi Co., Ltd. such as Blenmer PME-100, Blenmer PME-200, Blenmer PME-400, Blenmer PME-1000, Blenmer PME-4000, Blenmer AME-400, Blenmer 50POEP-800B, Blenmer 50AOEP-800B, Blenmer PLE-200, Blenmer ALE-200, Blenmer ALE-800, Blenmer PSE-400, Blenmer PSE-1300, Blenmer ASEP Series, Blenmer PKEP Series, Blenmer AKEP Series, Blenmer ANE-300, Blenmer ANE-1300, Blenmer PNEP Series, Blenmer PNPE Series, Blenmer 43 ANEP-500, Blenmer 70ANEP-550, and products manufactured by Kyoei Chemicals Co., Ltd. such as Light Ester MC, Light Ester 130MA, Light Esters 041MA, Light Acrylate BO-A, Light Acrylate EC-A, Light Acrylate MTG-A, Light Acrylate 130A, Light Acrylate DPM-A, Light Acrylate P-200A, Light Acrylate NP-4EA, Light Acrylate NP-8EA and the like.

The minimum constitutional unit in the polymer (b1-1), which has the polymerizable monomer component having at least one carboxyl group and at least one polymerizable unsaturated group may be alone, or two or more in combination. It is possible to use the compound obtained by copolymerizing two or more minimum constitutional units having the same acidic group, or two or more minimum constitutional units having different acidic groups. A method which is usable for copolymerization may be a conventional method such as a graft copolymerization, a block copolymerization, a random copolymerization and the like.

(b1-2) Alkali-soluble polymer having a carboxyl group, which has as a basic skeleton, a reaction product of a diol compound having a carboxyl group represented by the following general formula (V), (VI) or (VII) and a diisocyanate compound represented by the following formula (X)

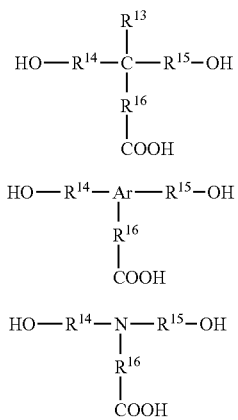
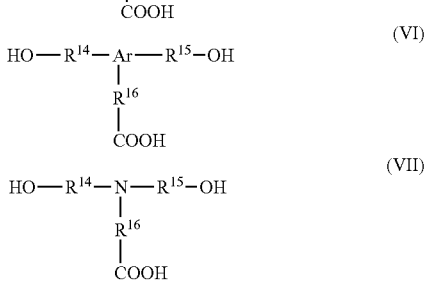

wherein $R^{13}$ represents hydrogen atom, or an alkyl, alkenyl, aralkyl, aryl, alkoxy or aryloxy group which may have a substituent such as alkyl, aryl, alkoxy, ester, urethane, amide, ureido and halogeno group, and preferably hydrogen atom, an alkyl group having 1 to 8 carbon atoms, an alkenyl group having 2 to 8 carbon atoms, and an aryl group having 6 to 15 carbon atoms; $R^{14}$, $R^{15}$ and $R^{16}$, which may be the same or different, each represent a single bond, a bivalent aliphatic or aromatic hydrocarbon group which may have a substituent such as alkyl, alkenyl, aralkyl, aryl, alkoxy and halogeno group, preferably an alkylene group having 1 to 20 carbon atoms and an arylene group having 6 to 15 carbon atoms, and more preferably an alkylene group having 1 to 8 carbon atoms.

Where necessary, $R^{14}$, $R^{15}$ and $R^{16}$ may have additionally a functional group which is not reactive to an isocyanate group, such as ester group, urethane group, amide group, ureido group and unsaturated bond between carbons. Two or three of $R^{13}$, $R^{14}$, $R^{15}$ and $R^{16}$ may form a ring together.

Ar represents a trivalent aromatic hydrocarbon group which may have a substituent, and preferably an aromatic group having 6 to 15 carbon atoms.

$$OCN-R^{18}-NCO \qquad (X)$$

wherein $R^{18}$ represents a bivalent aliphatic or aromatic hydrocarbon group which may have a substituent such as alkyl, alkenyl, aralkyl, aryl, alkoxy and halogeno group. Where necessary, $R^{18}$ may have additionally a functional group which is not reactive to an isocyanate group, such as ester group, urethane group, amide group, ureido group and unsaturated bond between carbons.

The diol compound having a carboxyl group represented by the formula (V), (VI) or (VII) includes 3,5-dihydroxy benzoic acid, 2,2-bis(hydroxymethyl) propionic acid, 2,2-bis(2-hydroxyethyl) propionic acid, 2,2-bis(3-hydroxypropyl) propionic acid, bis(hydroxymethyl) acetic acid, bis(4-hydroxyphenyl) acetic acid, 4,4-bis(4-hydroxyphenyl) pentanoic acid, tartaric acid, N,N-bis(2-hydroxyethyl)-3-carboxy-propionamide, and the like.

The alkali-soluble polymer having a carboxyl group (b1-2) is preferably a reaction product wherein a diol compound represented the following general formula (VIII) or (IX) is combined.

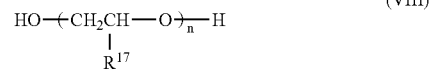
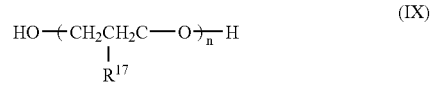

wherein $R^{17}$ each represents hydrogen atom or an alkyl group having 1 to 8 carbon atoms, n represents an integer of 2 or more. The alkyl group having 1 to 8 carbon atoms represented by $R^{17}$ includes methyl, ethyl, isopropyl, n-butyl and isobutyl groups.

Specific examples of the diol represented by the formula (VIII) or (IX) are shown below, but the present invention is not restricted to these specific ones at all.

Examples or the compound represented by the formula (VIII):
HO—(—CH$_2$CH$_2$O—)$_3$—H
HO—(—CH$_2$CH$_2$O—)$_4$—H
HO—(—CH$_2$CH$_2$O—)$_5$—H
HO—(—CH$_2$CH$_2$O—)$_6$—H
HO—(—CH$_2$CH$_2$O—)$_7$—H
HO—(—CH$_2$CH$_2$O—)$_8$—H
HO—(—CH$_2$CH$_2$O—)$_{10}$—H
HO—(—CH$_2$CH$_2$O—)$_{12}$—H
Polyethylene glycol (average molecular weight: 1000)
Polyethylene glycol (average molecular weight: 2000)
Polyethylene glycol (average molecular weight: 4000)
HO—(—CH$_2$CH(CH$_3$)O—)$_3$—H
HO—(—CH$_2$CH(CH$_3$)O—)$_4$—H
HO—(—CH$_2$CH(CH$_3$)O—)$_6$—H
Polypropylene glycol (average molecular weight: 1000)
Polypropylene glycol (average molecular weight: 2000)
Polypropylene glycol (average molecular weight: 4000)
Examples or the compound represented by the formula (IX):
HO—(—CH$_2$CH$_2$CH$_2$O—)$_3$—H
HO—(—CH$_2$CH$_2$CH$_2$O—)$_4$—H
HO—(—CH$_2$CH$_2$CH$_2$O—)$_8$—H
HO—(—CH$_2$CH$_2$CH(CH$_3$)O—)$_{12}$—H Specific examples of the diisocyanate compound represented by the formula (X) are aromatic diisocyanate compounds such as 2,4-tolylenediisocyanate, dimer of 2,4-tolylenediisocyanate, 2,6-tolylenediisocyanate, p-xylylenediisocyanate, m-xylylenediisocyanate, 4,4'-diphenylmethan diisocyanate, 1,5-naphthalene diisocyanate and 3,3'-dimethylbiphenyl-4,4'-diisocyanate, aliphatic diisocyanate compounds such as hexamethylene diisocyanate, trimethylhexamethylene diisocyanate, lysine diisocyanate and dimer acid diisocyanate, aliphatic diisocyanate compounds such as isophorone diisocyanate, 4,4'-methylene bis(cyclohexylisocyanate), methylcyclohexane-2,4(2,6)-diisocyanate and 1,3-(isocyanate methyl)cyclohexane, and a reaction product of a diol and a diisocyanate such as an adduct of 1 mole of 1,3-butylene glycol and 2 moles of tolylenediisocyanate.

In the synthesis of the polymer (b1-2), a molar ratio of the diisocyanate compound and the diol compound which are used is preferably from 0.8:1 to 1.2:1. When an isocyanate group remains at the terminal of polymers obtained, the polymer can be treated with alcohols or amines to finally synthesize ones free of an isocyanate group.

As the component (B1), any one or any combination of at least two selected from the polymers (b1-1) and (b1-2) can be used.

The amount of the repeating unit having a carboxyl group in the component (B1) is generally 2 mol % or more on the basis of the total monomeric amount in the component (B1), preferably from 2 to 70 mol %, and more preferably from 5 to 60 mol %.

The component (B1) has preferably a weight-average molecular weight of from 3,000 to 300,000, and more preferably from 6,000 to 100,000.

The amount of the compound (B1) in the image forming layer ranges generally from 0.005 to 80% by weight, preferably from 0.01 to 50% by weight, and more preferably from 1 to 20% by weight, based on the total weight of the solid content in the image forming layer.

One kind of alkali-soluble polymer mentioned above may be used alone in the upper heat-sensitive layer, or two or more polymers may be used in combination. The upper heat-sensitive layer is required to cause strong hydrogen bonding at the non-exposed portion, and to readily and selectively release the hydrogen bond when exposed to light. In consideration of this, the phenolic hydroxyl group-containing resin is preferably used for the upper heat-sensitive layer, and in particular, the novolak type resin is more preferable in the present invention.

In the lower layer, the above-mentioned alkali-soluble polymers may be used alone or in combination. Among the above polymers, preferably used are acrylic resins, in particular, acrylic resins having sulfonamide group. Such acrylic resins may be used alone or in combination.

In the upper heat-sensitive layer, the alkali-soluble polymer may be contained in an amount of 50 to 90% by weight from the aspect of durability and sensitivity of the heat-sensitive layer.

In addition, two or more alkali-soluble polymers with different solution velocities with respect to an alkaline aqueous solution may be used at an arbitrary mixing ratio in the upper heat-sensitive layer.

Preferably, in the upper heat-sensitive layer, the phenolic hydroxyl group-containing alkali-soluble polymer may be used in an amount of 60 to 99.8% by weight with respect to the total weight of the entire alkali-soluble polymers for use in the upper heat-sensitive layer. This is because the phenolic hydroxyl group-containing polymer is characterized in that strong hydrogen bonding can take place at the non-exposed portion, and pat of the hydrogen bond is readily released when exposed to light as mentioned above.

[Infrared Absorption Dye]

In the heat-sensitive PS plate for lithographic printing for use in the present invention, the kind of infrared absorption dye used in the heat-sensitive image forming layer is not particularly limited so long as the infrared absorption dye can absorb infrared radiation to generate heat. A variety of dyes known as the infrared absorption dyes can be used.

There can be employed commercially available infrared absorption dyes and conventional ones described in references, for example, "Senryo Binran" published in 1970, by The Society of Synthetic Organic Chemistry, Japan. Examples of the infrared absorption dyes include azo dyes, metal complex salt azo dyes, pyrazolone azo dyes, anthraquinone dyes, phthalocyanine dyes, carbonium dyes, quinoneimine dyes, methine dyes, and cyanine dyes.

Particularly preferable are infrared or near infrared absorption dyes because of an advantage in their suitability for using with infrared or near infrared radiation laser beams as the means for light exposure.

Specific examples of the infrared or near infrared absorption dyes are as follows: cyanine dyes disclosed in JP KOKAI Nos. Sho 58-125246, 59-84356, 59-202829 and 60-78787; methine dyes disclosed in JP KOKAI Nos. Sho 58-173696, 58-181690 and 58-194595; naphthoquinone dyes disclosed in JP KOKAI Nos. Sho 58-112793, 58-224793, 59-48187, 59-73996, 60-52940 and 60-63744; squarylium dyes disclosed in JP KOKAI No. Sho 58-112792; and cyanine dyes disclosed in British Patent No. 434,875.

In addition, near infrared absorption sensitizers disclosed in U.S. Pat. No. 5,156,938; arylbenzo(thio)pyrylium salts disclosed in U.S. Pat. No. 3,881,924; trimethine thiapyrylium salts disclosed in JP KOKAI No. Sho 57-142645 (U.S. Pat. No. 4,327,169); pyrylium compounds disclosed in JP KOKAI Nos. Sho 58-181051, 58-220143, 59-41363, 59-84248, 59-84249, 59-146063 and 59-146061; cyanine dyes disclosed in JP KOKAI No. Sho 59-216146; pentamethine thiopyrylium salts disclosed in U.S. Pat. No. 4,283,475; pyrylium compounds disclosed in JP KOKOKU Nos. Hei 5-13514 and 5-19702 (JP KOKOKU herein means Japanese patent publication for opposition purpose); and commercially available products "Epolight III-178", "Epolight III-130" and "Epolight III-125" (trade names) made by Epolin, Inc., are preferably used as the infrared absorption dyes in the present invention.

Another examples of the dyes especially preferred in the present invention are near infrared absorption dyes described in U.S. Pat. No. 4,756,993, which dyes are represented by formulas (I) and (II) in the specification.

The above-mentioned infrared absorption dyes can be contained not only in the upper heat-sensitive layer, but also in the lower layer. Addition of the infrared absorption dye to the lower layer allows the lower layer to function as a heat-sensitive layer. In the case where the infrared absorption Odye is added to the lower layer, the dye for the lower layer may be the same as that used in the upper heat-sensitive layer or different therefrom.

Such an infrared absorption dye and other components may be contained together in one heat-sensitive layer, or an infrared absorption dye-containing layer may be provided separately. In the case where the infrared absorption dye-containing layer is provided separately, it is desirable to dispose the infrared absorption dye-containing layer adjacent to the heat-sensitive layer. It is preferable that such a dye and the above-mentioned alkali-soluble resin be contained in the same layer, although it is possible to add a dye and an alkali-soluble resin to the respective layers.

When the infrared absorption dye is added to the upper heat-sensitive layer, the dye may be contained in an amount of 0.01 to 50% by weight from the aspect of sensitivity and durability of the upper heat-sensitive layer, preferably 0.1 to 30% by weight, and more preferably 1.0 to 30% by weight, with respect to the total solid content of the image forming material for use in the upper heat-sensitive layer of the PS plate.

In the case of the lower layer, the dye may be contained in an amount of 0 to 20% by weight, preferably 0 to 10% by weight, and more preferably 0 to 5% by weight, with respect to the total solid content of the image forming material for use in the lower layer of the PS plate. Although the addition of the infrared absorption dye to the lower layer lowers the solubility of the image forming material for use in the lower layer in the alkaline developing solution, an increase in solubility of the image forming material for use in the lower layer in the developing solution can be expected after light exposure. However, an increase in the solubility resulting from the irradiation of light at the step of light exposure cannot be observed around the area of the lower layer adjacent to the substrate, that is, the area within a distance of 0.2 to 0.3 μm from the substrate. Namely, the decrease in solubility of the lower layer caused by the addition of the infrared absorption dye may become a factor to lower the sensitivity. In light of this, it is not desirable that the infrared absorption dye be added to the lower layer in such an amount that will decrease the solubility velocity of the lower layer to less than 30 nm.

[Other Additives]

For the formation of the lower layer, a variety of additives may be used if necessary, in addition to the above-mentioned essential component so as not to impair the effects of the present invention. Similarly, various additives may be contained in the upper heat-sensitive layer in addition to the essential components when necessary as long as the effects of the present invention are not impaired. Such additives may be contained only in the lower layer, or only in the upper heat-sensitive layer. Alternatively, both layers may comprise such additives. Examples of the additives for use in the present invention are as follows:

(1) Compounds Capable of Inhibiting the Solubility of Image Forming Material in Developing Solution In the heat-sensitive PS plate for lithographic printing for use in the present invention, the image forming layer may further comprise a variety of inhibitors that can inhibit the alkali-soluble polymer from easily dissolving in the developing solution.

The above-mentioned inhibitors are not particularly limited, and quaternary ammonium salts and polyethylene glycol compounds can be used.

The quaternary ammonium salts are not particularly limited, but include tetraalkyl ammonium salt, trialkylaryl ammonium salt, dialkyldiaryl ammonium salt, alkyltriaryl ammonium salt, tetraaryl ammonium salt, cyclic ammonium salt, and bicyclic ammonium salt.

Specific examples of the quaternary ammonium salts are tetrabutyl ammonium bromide, tetrapentyl ammonium bromide, tetrahexyl ammonium bromide, tetraoctyl ammonium bromide, tetralauryl ammonium bromide, tetraphenyl ammonium bromide, tetranaphthyl ammonium bromide, tetrabutyl ammonium chloride, tetrabutyl ammonium iodide, tetrastearyl ammonium bromide, lauryl trimethyl ammonium bromide, stearyl trimethyl ammonium bromide, behenyl trimethyl ammonium bromide, lauryl triethyl ammonium bromide, phenyl trimethyl ammonium bromide, 3-trifluoromethylphenyl trimethyl ammonium bromide, benzyl trimethyl ammonium bromide, dibenzyl dimethyl ammonium bromide, distearyl dimethyl ammonium bromide, tristearylmethyl ammonium bromide, benzyltriethyl ammonium bromide, hydroxyphenyl trimethyl ammonium bromide, and N-methylpyridinium bromide. In particular, quaternary ammonium salts described in JP Application Nos. 2001-226297, 2001-370059, and 2001-398047 are preferably used.

It is preferable that the quaternary ammonium salt serving as the above-mentioned inhibitor be contained in the image forming layer in an amount of 0.1 to 50% by weight from the aspect of sufficient inhibiting effect and no adverse effect on film-forming properties of binders, more preferably 1 to 30% by weight, in terms of the solid content with respect to the total weight of the solid content of the image forming layer.

The polyethylene glycol compound used as the aforementioned inhibitor is not particularly limited. The polyethylene glycol with the following structure is preferably employed in the present invention.

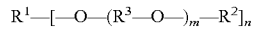

wherein $R^1$ is a residue of a polyhydric alcohol or polyhydric phenol; $R^2$ is a hydrogen atom, or an alkyl group, an alkenyl group, an alkynyl group, alkyloyl group, an aryl group, or an aryloyl group, which has 1 to 25 carbon atoms and may have a substituent; $R^3$ is a residue of an alkylene group which may have a substituent; m is 10 or more on average; and n is an integer of 1 to 4.

Examples of the polyethylene glycol compounds having the above-mentioned structure include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene glycol sorbitol esters, polypropylene glycol sorbitol esters, polyethylene glycol fatty acid esters, polypropylene glycol fatty acid esters, polyethylene glycol ethylenediamines, polypropylene glycol ethylenediamines, polyethylene glycol diethylenetriamines, and polypropylene glycol diethylenetriamines.

Specific examples of the above-mentioned polyethylene glycol compounds are polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic ester, polyethylene glycol lauryl ester, polyethylene glycol dilauryl ester, polyethylene glycol nonylic ester, polyethylene glycol cetylic ester, polyethylene glycol stearoyl ester, polyethylene glycol distearoyl ester, polyethylene glycol behenic ester, polyethylene glycol dibehenic ester, polypropylene glycol acetyl ester, polypropylene glycol diacetyl ester, polypropylene glycol benzoic ester, polypropylene glycol dibenzoic ester, polypropylene glycol lauryl ester, polypropylene glycol dilauryl ester, polypropylene glycol nonylic ester, polyethylene glycol glycerin ether, polypropylene glycol glycerin ether, polyethylene glycol sorbitol ether, polypropylene glycol sorbitol ether, polyethylene glycol ethylenediamine, polypropylene glycol ethylenediamine, polyethylene glycol diethylenetriamine, polypropylene glycol diethylenetriamine, and polyethylene glycol pentamethylenehexamine.

The amount of the polyethylene glycol compound may be in the range of 0.1 to 50% by weight from the aspect of sufficient inhibiting effect and no adverse effect on film-forming properties of binders, preferably 1 to 30% by weight, in terms of the solid content with respect to the total weight of the solid content for use in the image forming layer.

The decrease in sensitivity, which is caused when the solubility of the alkali-soluble polymer in the developing solution is inhibited as mentioned above, can effectively be avoided by the addition of a lactone compound. When the developing solution permeates through the light-exposed portion of the image forming layer, the lactone compound reacts with the developing solution to form a carboxylic acid compound, which will contribute to dissolving of the light-exposed portion of the image forming layer. Thus, the decrease in sensitivity can be prevented.

The lactone compound for use in the present invention is not particularly limited. For example, lactone compounds represented by the following formulas (L-I) and (L-II) can be used.

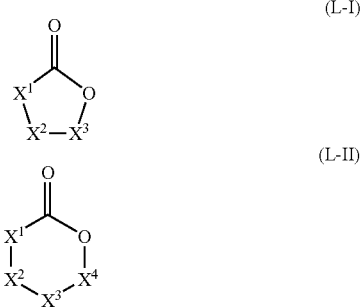

In the above formulas (L-I) and (L-II), $X^1$, $X^2$, $X^3$ and $X^4$ are each an atom or a group for forming a ring, which may be the same or different and independently have a substituent. At least one of $X^1$, $X^2$ or $X^3$ in the formula (L-I), and at least one of $X^1$, $X^2$, $X^3$ or $X^4$ in the formula (L-II) have an electron attractive substituent or a substituent having an electron attractive substituent.

The atoms or groups represented by $X^1$, $X^2$, $X^3$ and $X^4$ which constitute the ring are each a non-metallic atom having two single bonds or a group including the above-mentioned non-metallic atom for forming the ring.

Preferable non-metallic atoms and preferable groups including the non-metallic atoms are methylene group, sulfinyl group, carbonyl group, thiocarbonyl group, sulfonyl group, sulfur atom, oxygen atom, and selenium atom. In particular, methylene group, carbonyl group and sulfonyl group are preferably used.

As mentioned above, at least one of $X^1$, $X^2$ or $X^3$ in the formula (L-I), and at least one of $X^1$, $X^2$, $X^3$ or $X^4$ in the formula (L-II) have an electron attractive group. The electron attractive group herein used is a group where the Hammett's substituent constant represented by σp is positive. For the Hammett's substituent constant, Journal of Medicinal Chemistry, 1973, vol. 16, No. 11, 1207-1216 can serve as a reference. Examples of the electron attractive group where the Hammett's substituent constant represented by σp is a positive value include a halogen atom such as fluorine atom (σp value of 0.06), chlorine atom (σp value of 0.23), bromine atom (σp value of 0.23) and iodine atom (σp value of 0.18); trihaloalkyl group such as tribromomethyl group (σp value of 0.29), trichloromethyl group (σp value of 0.33) and trifluoromethyl group (σp value of 0.54); cyano group (σp value of 0.66); nitro group (σp value of 0.78); aliphatic, aryl or heterocyclic sulfonyl group such as methanesulfonyl group (σp value of 0.72); aliphatic, aryl or heterocyclic acyl group such as acetyl group (σp value of 0.50) and benzoyl group (σp value of 0.43); alkynyl group such as C≡CH group (σp value of 0.23); aliphatic, aryl or heterocyclic oxycarbonyl group such as methoxycarbonyl group (σp value of 0.45) and phenoxycarbonyl group (σp value of 0.44); carbamoyl group (σp value of 0.36); sulfamoyl group (σp value of 0.57); sulfoxide group; heterocyclic group; oxo group; and phosphoryl group.

Preferable examples of the electron attractive groups are amide group, azo group, nitro group, fluoroalkyl group having 1 to 5 carbon atoms, nitrile group, alkoxycarbonyl group having 1 to 5 carbon atoms, acyl group having 1 to 5 carbon atoms, alkylsulfonyl group having 1 to 9 carbon atoms, arylsulfonyl group having 6 to 9 carbon atoms, alkylsulfinyl group having 1 to 9 carbon atoms, arylsulfinyl group having 6 to 9 carbon atoms, arylcarbonyl group having 6 to 9 carbon atoms, thiocarbonyl group, fluorine-containing alkyl group having 1 to 9 carbon atoms, fluorine-containing aryl group having 6 to 9 carbon atoms, fluorine-containing allyl group having 3 to 9 carbon atoms, oxo group, and halogen atoms.

Among the above groups, more preferably used are nitro group, fluoroalkyl group having 1 to 5 carbon atoms, nitrile group, alkoxycarbonyl group having 1 to 5 carbon atoms, acyl group having 1 to 5 carbon atoms, arylsulfonyl group having 6 to 9 carbon atoms, arylcarbonyl group having 6 to 9 carbon atoms, oxo group, and halogen atoms.

Specific examples of the compounds represented by formulas (L-I) and (L-II) are shown as follows. However, the lactone compounds for use in the present invention are not limited to the following examples.

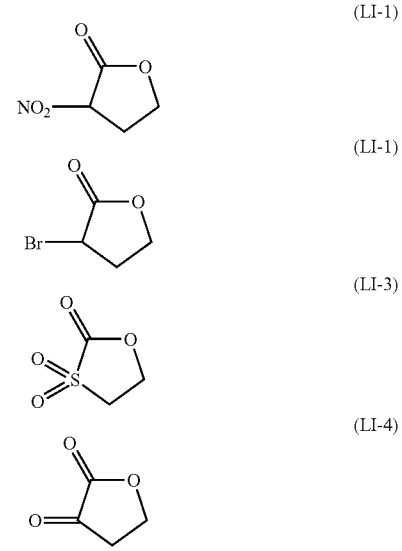

-continued
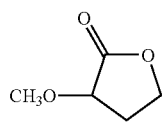 (LI-5)
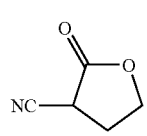 (LI-6)
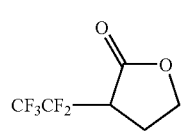 (LI-7)
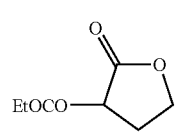 (LI-8)
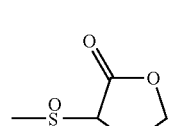 (LI-9)
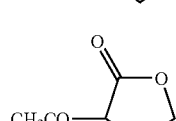 (LI-10)
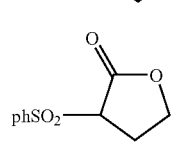 (LI-11)
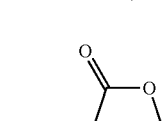 (LI-12)
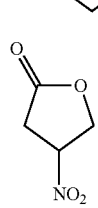 (LI-13)
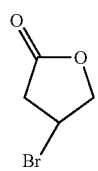 (LI-14)
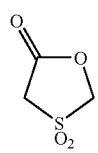 (LI-15)
-continued
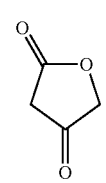 (LI-16)
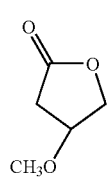 (LI-17)
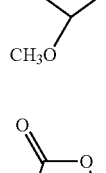 (LI-18)
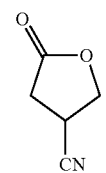 (LI-19)
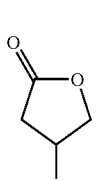 (LI-20)
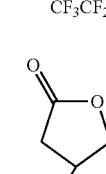 (LI-21)
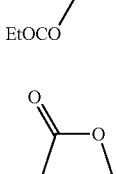 (LI-22)
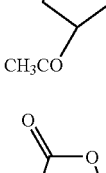 (LI-23)
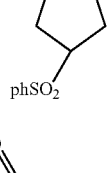 (LI-24)

-continued

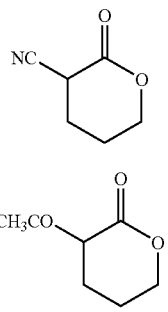

(LII-1)

(LII-2)

The lactone compound represented by formulas (L-I) and (L-II) may be contained in the image forming layer in an amount of 0.1 to 50% by weight from the aspect of satisfactory effect and image forming performance, preferably 1 to 30% by weight, in terms of the solid content with respect to the total weight of the solid content of the image forming layer. It is desirable that the lactone compound be selectively brought into contact with the developing solution to cause the reaction therewith.

The above-mentioned lactone compounds may be used alone or in combination. Further, two or more kinds of lactone compounds having formula (L-I) and two or more kinds of lactone compounds having formula (L-II) may be used together at an arbitrary mixing ratio so that the total weight of the lactone compounds is within the above-mentioned range.

Moreover, to further effectively inhibit the non-light exposed portion of the image forming layer from unfavorably dissolving in the developing solution, it is also preferable to use materials which can be pyrolytically decomposed and can substantially decrease the solubility of the alkali-soluble polymer in the alkaline developing solution before pyrolytical decomposition. Such materials include onium salts, o-quinonediazide compounds, aromatic sulfone compounds, and aromatic sulfonic acid ester compounds. The onium salts include diazonium salt, ammonium salt, phosphonium salt, iodonium salt, sulfonium salt, selenonium salt, arsonium salt and the like.

More specifically, preferable examples of the onium salts are diazonium salts described in S. I. Schlesinger, Photogr. Sci. Eng., 18, 387 (1974), T. S. Bal et al., Polymer, 21, 423 (1980), and JP KOKAI No. Hei 5-158230; ammonium salts described in U.S. Pat. Nos. 4,069,055 and 4,069,056, and JP KOKAI No. Hei 3-140140; phosphonium salts described in D. C. Necker et al., Macromolecules, 17, 2468 (1984), C. S. Wen et al., Teh, Proc. Conf. Rad. Curing ASIA, p478 Tokyo, October (1988), and U.S. Pat. Nos. 4,069,055 and 4,069, 056; iodonium salts described in J. V. Crivello et al., Macromolecules, 10(6), 1307 (1977), Chem. & Eng. News, November 28, p31 (1988), EP 104,143, U.S. Pat. Nos. 339,049 and 410,201, and JP KOKAI Nos. Hei 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V Crivello et al., Polymer Bull., 14, 279 (1985), J. V Crivello et al., Macromolecules, 14(5), 1141 (1981), J. V. Crivello et al., J. Polymer Sci., Polymer Chem. Ed., 17, 2877 (1979), EP 370,693, EP 233,567, EP 297,443, EP 297,442, U.S. Pat. Nos. 4,933,377, 3,902,114, 410,201, 339,049, 4,760,013, 4,734,444 and 2,833,827, and DP Nos. 2,904,626, 3,604,580 and 3,604,581; selenonium salts described in J. V. Crivello et al., Macromolecules, 10(6), 1307 (1977), and J. V Crivello et al., J. Polymer Sci., Polymer Chem. Ed., 17, 1047 (1979); and arsonium salts described in C. S. Wen et al., Teh, Proc. Conf. Rad. Curing ASIA, p478 Tokyo, October (1988).

Of those onium salts, preferably used are diazonium salts, in particular, diazonium salts disclosed in JP KOKAI No. Hei 5-158230.

As the counter ions for the onium salts, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid and the like can be employed. In particular, hexafluorophosphoric acid and alkyl aromatic sulfonic acid such as triisopropylnaphthalenesulfonic acid and 2,5-dimethylbenzenesulfonic acid are preferably used.

Suitable quinonediazide compounds for use in the present invention include o-quinonediazide compounds. The o-quinonediazide compound for use in the present invention is a compound having at least one o-quinonediazide group, which compound can exhibit increased alkali-solubility by pyrolysis. There can be employed o-quinonediazide compounds with various structures. The o-quinonediazide compounds herein used can contribute to the solubility characteristics of the image forming layer because the o-quinonediazide compounds have the characteristics that they lose the force to inhibit the binder agent from dissolving in the developing solution and the o-quinonediazide compounds themselves turns into alkali-soluble materials when thermally decomposed. For example, the o-quinonediazide compounds described in J. Kosar "Light-sensitive Systems" (John Wiley & Sons. Inc.) pp. 339–352 can be used in the present invention. In particular, sulfonic esters of o-quinonediazide compounds or sulfonamides obtained by the reaction with a variety of aromatic polyhydroxyl compounds or aromatic amino compounds are preferable. In addition, esters of benzoquinone-(1,2)-diazidesulfonic acid chloride or naphthoquinone-(1,2)-diazide-5-sulfonic acid chloride with pyrogallol-acetone resin as described in JP KOKOKU No. Sho 43-28403; and esters of benzoquinone-(1,2)-diazidesulfonic acid chloride or naphthoquinone-(1,2)-diazide-5-sulfonic acid chloride with phenol-formaldehyde resin as described in U.S. Pat. Nos. 3,046,120 and 3,188,210 are also preferably used in the present invention.

Similarly, esters of naphthoquinone-(1,2)-diazide-4-sulfonic acid chloride with phenol-formaldehyde resin or cresol-formaldehyde resin, and esters of naphthoquinone-(1,2)-diazide-4-sulfonic acid chloride with pyrogallol-acetone resin can also be preferably employed. Other suitable o-quinonediazide compounds are described in many patent specifications, for example, JP KOKAI Nos. Sho 47-5303, 48-63802, 48-63803, 48-96575, 49-38701 and 48-13354, JP KOKOKU Nos. Sho 41-11222, 45-9610 and 49-17481, U.S. Pat. Nos. 2,797,213, 3,454,400, 3,544,323, 3,573,917, 3,674,495 and 3,785,825, BP Nos. 1,227,602, 1,251,345, 1,267,005, 1,329,888 and 1,330,932, and DP No. 854,890.

It is preferable that the o-quinonediazide compound be contained in an amount of 1 to 50% by weight, more preferably 5 to 30% by weight, and most preferably 10 to 30% by weight, with respect to the total solid content of the image forming layer. The above-mentioned o-quinonediazide compounds may be used alone or in combination.

To more effectively inhibit the alkali-soluble polymer from dissolving in the developing solution, and at the same time, to impart the increased scratch resistance to the surface portion of the image forming layer, it is preferable that the image forming layer further comprise polymers including a (meth)acrylate monomer having two or three perfluoroalkyl groups with 3 to 20 carbon atoms in the molecule thereof, as described in JP KOKAI No. 2000-187318.

Such a polymer may be contained in an amount of 0.1 to 10% by weight, more preferably 0.5 to 5% by weight of the total weight of the image forming layer.

(2) Development Promoting Agent

The upper heat-sensitive layer and the lower layer of the PS plate may further comprise acid anhydrides, phenolics and organic acids to improve the sensitivity.

With respect to the acid anhydrides, cyclic acid anhydrides are preferable. More specifically, the cyclic acid anhydrides include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenyl maleic anhydride, succinic anhydride, and pyromellitic anhydride disclosed in U.S. Pat. No. 4,115,128. Non-cyclic acid anhydrides include acetic anhydride.

Examples of the phenolics for use in the present invention are bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

The organic acids include sulfonic acids, sulfinic acids, alkylsulfuric acids, phosphonic acids, phosphoric esters, and carboxylic acids as described in JP KOKAI Nos. Sho 60-88942 and Hei 2-96755. Specific examples of the organic acids are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

It is preferable that the above-mentioned acid anhydrides, phenolics and organic acids be contained in an amount of 0.05 to 20% by weight, more preferably 0.1 to 15% by weight, and most preferably 0.1 to 10% by weight, with respect to the total weight of the image forming layer.

(3) Surfactant

The upper heat-sensitive layer and the lower layer may further comprise nonionic surfactants as described in JP KOKAI Nos. Sho 62-251740 and Hei 3-208514, ampholytic surfactants as described in JP KOKAI Nos. Sho 59-121044 and Hei 4-13149, siloxane compounds as described in EP 950,517, and copolymers comprising a fluorine-containing monomer as described in JP KOKAI Nos. Sho 62-170950 and Hei 11-288093 and JP Application No. 2001-247351 to upgrade the coating properties and ensure the stable operation depending upon the development conditions.

Specific examples of the nonionic surfactants are sorbitan tristearate, sorbitan monopalmitate, sorbitan trioleate, stearic acid monoglyceride, and polyoxyethylene nonylphenyl ether. Specific examples of the ampholytic surfactants are alkyldi(aminoethyl)glycine, alkylpolyaminoethylglycine hydrochloride, 2-alkyl-N-carboxyethyl-N-hydroxyethyl imidazolinium betaine, and N-tetradecyl-N,N-betaine (e.g., "Amogen" (trade name) made by Dai-Ichi Kogyo Seiyaku Co., Ltd.).

Block copolymers of dimethyl siloxane and polyalkylene oxide are preferably employed as the siloxane compounds. More specifically, commercially available polyalkylene oxide modified silicone products such as "DBE-224", "DBE-621", "DBE-712", "DBP-732" and "DBP-534", made by Chisso Corporation; and "Tego Glide 100" (trade name), made by Tego Chemie Service GmbH can preferably be employed in the present invention.

It is preferable that the amount of the above-mentioned nonionic surfactants and ampholytic surfactants be in the range of 0.01 to 15% by weight, more preferably 0.1 to 5% by weight, and most preferably 0.05 to 0.5% by weight, with respect to the total weight of the image forming layer.

(4) Printing-out Agent/Coloring Agent

The upper heat-sensitive layer and the lower layer of the PS plate for use in the present invention may comprise a printing-out agent and a coloring agent for images such as a dye and a pigment to obtain visible images immediately after the image forming layer is heated by light exposure.

One of the representative examples of the printing-out agent is a combination of a compound capable of generating an acid when heated by light exposure and an organic dye capable of forming a salt together with the above-mentioned acid-generating compound. Examples of such a printing-out agent include the combination of o-naphthoquinonediazide-4-sulfonic acid halogenide with a salt-forming organic dye disclosed in JP KOKAI Nos. Sho 50-36209 and 53-8128, and the combination of a trihalomethyl compound with a salt-forming organic dye disclosed in JP KOKAI Nos. Sho 53-36223, 54-74728, 60-3626, 61-143748, 61-151644 and 63-58440. The above-mentioned trihalomethyl compound includes oxazole compounds and triazine compounds, both of which can exhibit excellent stability with time and produce clear printed-out images.

The coloring agent for forming image portions includes not only the above-mentioned salt-forming organic dyes, but also other dyes. Preferable dyes including the salt-forming organic dyes are classified into oil-soluble dyes and basic dyes. Specific examples of such dyes are Oil Yellow #101, Oil Yellow #103, Oil Pink #312, Oil Green BG, Oil Blue BOS, Oil Blue #603, Oil Black BY, Oil Black BS, and Oil Black T-505, which are made by Orient Chemical Industries, Ltd.; and Victoria Pure Blue, Crystal Violet Lactone, Crystal Violet (CI 42555), Methyl Violet (CI 42535), Ethyl Violet, Rhodamine B (CI 145170B), Malachite Green (CI 42000), and Methylene Blue (CI 52015). Dyes disclosed in JP KOKAI No. Sho 62-293247 are particularly preferable. Those dyes may be contained in an amount of 0.01 to 10% by weight, preferably 0.1 to 3% by weight, with respect to the total solid content of the image forming layer.

(5) Plasticizer

The upper heat-sensitive layer and the lower layer of the PS plate for use in the present invention may further comprise a plasticizer, if necessary, to impart the flexibility and other properties to the respective layers. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

(6) Wax

The upper heat-sensitive layer and the lower layer of the PS plate for use in the present invention may further comprise a compound for decreasing the coefficient of static friction of the surface so as to improve the scratch resistance. More specifically, compounds having a long-chain alkylcarboxylic ester as described in U.S. Pat. No. 6,117,913 and JP Application Nos. 2001-261627, 2002-032904 and 2002-165584 can be used as the wax.

Such a wax may be contained in an amount of 0.1 to 10% by weight, preferably 0.5 to 5% by weight, with respect to the total weight of the upper heat-sensitive layer or the lower layer.

Usually, to provide the upper heat-sensitive layer and the lower layer of the PS plate for lithographic printing, a coating liquid for forming each layer may be prepared by dissolving the above-mentioned components in a solvent, and the coating liquid for formation of the lower layer may be coated on a proper substrate, and the coating liquid for formation of the upper heat-sensitive layer may be coated on the resultant lower layer.

Examples of the solvent used to prepare the coating liquids for the upper heat-sensitive layer and the lower layer include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene. The solvents for use in the present invention are not limited to the above-mentioned examples. Those solvents may be used alone or in combination.

In selecting the solvents for preparation of the coating liquids, it is desirably considered as a rule to choose a solvent so that the solubility of the alkali-soluble polymer for use in the upper heat-sensitive layer in the solvent is different from that of the alkali-soluble polymer for use in the lower layer in the solvent. However, for the purpose of obtaining another function, a conscious choice to make both alkali-soluble polymers partially soluble in each other is possible when the solvent is selected.

The method for providing the upper heat-sensitive layer and the lower layer separately will now be explained. For example, the above-mentioned two layers can be provided separately by utilizing a difference between the solvent solubility of the copolymer for use in the lower layer and that of the alkali-soluble resin for use in the upper heat-sensitive layer. Alternatively, separation of the two layers can be achieved by removing the solvent component through rapid drying after the coating liquid for the upper heat-sensitive layer is applied to the lower layer. Those two methods will be described in detail, but the method for providing the two layers separately is not limited to those two methods.

In the former method, that is, the method of utilizing a difference between the solvent solubility of the copolymer for the lower layer and that of the alkali-soluble resin for the upper heat-sensitive layer, a solvent system in which a particular copolymer and other copolymers used together for the formation of the lower layer are not soluble is employed for preparation of the coating liquid for the upper heat-sensitive layer containing an alkali-soluble resin. By selecting such a solvent for providing the upper heat-sensitive layer, the lower layer and the upper heat-sensitive layer can completely be separated from each other even though both layers are provided by coating. For example, a particular monomer is chosen to determine a copolymer comprising the above-mentioned monomer for forming the lower layer on the precondition that the monomer is insoluble in a solvent (e.g., methyl ethyl ketone and 1-methoxy-2-propanol) which is used to prepare a coating liquid for the upper heat-sensitive layer by dissolving an alkali-soluble resin for the upper heat-sensitive therein. Using a solvent capable of dissolving the above-mentioned copolymer for use in the lower layer, a coating liquid for forming the lower layer is prepared by dissolving the above-mentioned copolymer in the solvent, and coated on a substrate and dried. After that, a coating liquid for the upper heat-sensitive layer comprising the alkali-soluble resin is prepared using the solvent such as methyl ethyl ketone or 1-methoxy-2-propanol, and coated on the lower layer. Those two layers can thus be provided separately.

The latter method of quickly drying the coating liquid for the upper heat-sensitive layer after coating can be achieved by blowing high-pressure air on the surface of a web from a slit nozzle disposed substantially perpendicularly to the web coating direction, or causing the web to pass over a heating roll which is charged with a heating medium such as steam in order to impart the heat energy to the web by conduction, or using the above-mentioned two means in combination.

The upper heat-sensitive layer and the lower layer may be partially soluble in each other to such an extent that each layer can exhibit its own function in the present invention, as mentioned above. This can be achieved by delicate control in any of the above-mentioned two methods.

The coating liquid for formation of the each layer may be prepared by dissolving the components into an appropriate solvent. The concentration of the entire solid content of the components including the additives in the solvent may be preferably in the range of 1 to 50% by weight. Various coating methods, for example, bar coater coating, spin coating, spray coating, curtain coating, dip coating, air knife coating, blade coating and roll coating can be employed.

It is desirable that the coating liquid for the upper heat-sensitive layer be applied to the lower layer by non-contact coating method not to cause damage to the lower layer during the coating operation for the upper heat-sensitive layer. If a contact coating method is employed, the bar coater method generally used in the solution coating may be feasible, but in this case, coating in the forward direction is desirable in light of the prevention of the damage to the lower layer.

The coating liquid for formation of the lower layer may preferably be applied to the substrate for use in the PS plate with a deposition amount ranging from 0.5 to 4.0 g/m$^2$ from the aspect of the printing durability, the image reproducibility and the sensitivity, and more preferably from 0.6 to 2.5 g/m$^2$.

The coating liquid for forming the upper heat-sensitive layer may preferably be applied to the lower layer with a deposition amount ranging from 0.05 to 1.0 g/m$^2$ from the aspect of the latitude for development, the scratch resistance and the sensitivity, and more preferably from 0.08 to 0.7 g/m$^2$.

The deposition amounts of the lower layer and the upper heat-sensitive layer may be within the range of 0.6 to 4.0 g/m$^2$ from the aspect of the printing durability, the image reproducibility and the sensitivity, and more preferably from 0.7 to 2.5 g/m$^2$ in total.

[Substrate]

In the heat-sensitive PS plate for lithographic printing for use in the present invention, any dimensionally stable plate-shaped materials with a required strength and durability can be used as the hydrophilic substrate. Preferably used are a sheet of paper; a laminated sheet prepared by covering paper with a thin layer of plastic, such as polyethylene, polypropylene or polystyrene; a metal plate made of, for example, aluminum, zinc or copper; a plastic film made of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal; and a sheet of paper or plastic film to which the above-mentioned metals are attached or deposited.

A polyester film and an aluminum plate are particularly preferable as the substrate for the PS plate in the present invention. In particular, the aluminum plate is most preferable because the dimensional stability is excellent and the cost is relatively low.

Aluminum plates substantially composed of pure aluminum or an aluminum alloy containing a trace amount of elements other than aluminum are suitable. In addition, plastic sheets to which the aluminum plate is attached or the aluminum is deposited are also preferable. Examples of the above-mentioned elements used in the aluminum alloys are silicon, iron, manganese, copper, magnesium, chromium, zinc, bismuth, nickel and titanium. The content of such elements for use in the aluminum alloy is at most 10% by weight.

Although the pure aluminum plates are particularly preferable for the substrate, production of perfectly pure aluminum is difficult from the viewpoint of the refining technique, so that a trace amount of different elements may be contained. In such a way, the composition of the aluminum plate is not particularly limited, and conventional aluminum plates may be appropriately used for the substrate of the PS plate in the present invention. The thickness of the aluminum plate serving as the substrate is within the range from about 0.1 to about 0.6 mm, preferably 0.15 to 0.4 mm, and more preferably 0.2 to 0.3 mm.

The aluminum plate may be first subjected to degreasing, if required, prior to the surface roughening treatment, using a surfactant, an organic solvent, or an aqueous alkaline solution to remove rolling oil from the surface of the aluminum plate.

To provide the aluminum plate with a grained surface, there can be used various methods, for example, a method of mechanically roughening the surface of the aluminum plate, a method of electrochemically dissolving the surface of the aluminum plate, and a method of chemically dissolving the selected portions of the aluminum plate surface. The mechanical graining includes conventional processes, such as ball graining, brush graining, blast graining, and buffing graining. The electrochemical graining can be carried out in an electrolytic solution such as a hydrochloric acid or nitric acid solution by the application of a direct current or alternating current. Moreover, the above-mentioned mechanical graining and electrochemical graining may be used in combination as disclosed in JP KOKAI No. Sho 54-63902.

The surface-grained aluminum plate thus obtained may be subjected to alkali etching, followed by neutralization. After that, an anodized film may usually be provided on the aluminum plate by anodization to improve the water retention properties and wear resistance.

Any material can be used as an electrolyte in the anodization of the aluminum plate so long as a porous anodized film can be formed on the surface of the aluminum plate. Typically, sulfuric acid, phosphoric acid, oxalic acid, chromic acid, and mixtures thereof are used as the electrolyte. The concentration of the electrolyte is appropriately determined depending upon the kind of electrolyte.

The operating conditions for the anodization cannot be particularly specified because they depend on the type of electrolyte. In general, it is proper that the concentration of the electrolyte be in the range of 1 to 80% by weight, the liquid temperature be controlled to 5 to 70° C., the current density be in the range of 5 to 60 A/dm$^2$, the applied voltage be in the range of 1 to 100 V, and the time for electrolysis be in the range of 10 seconds to 5 minutes. The deposition amount of the anodized film is suitably 1.0 g/m$^2$ or more, in the light of the sufficient printing durability, and prevention of toning by scratches on non-image areas.

After completion of the anodization, the surface of the aluminum plate may be made hydrophilic, if required. To make the aluminum surface hydrophilic, there can be employed an alkali metal silicate treatment (for example, using an aqueous solution of sodium silicate) as disclosed in U.S. Pat. Nos. 2,714,066, 3,181,461, 3,280,734 and 3,902,734. In such a silicate treatment, the aluminum substrate is immersed in an aqueous solution of sodium silicate or subjected to electrolysis therein. In addition to the silicate treatment, there can be employed other treatments using potassium fluorozirconate disclosed in JP KOKOKU No. Sho 36-22063 and polyvinylphosphonic acid disclosed in U.S. Pat. Nos. 3,276,868, 4,153,461, and 4,689,272.

The heat-sensitive PS plate for lithographic printing of positive-working mode for use in the present invention comprises a substrate and an image forming layer formed thereon, the image forming layer comprising at least two layers, that is, the above-mentioned lower layer and upper heat-sensitive positive-working mode layer which are successively provided on the substrate in this order. When necessary, the PS plate may further comprise an undercoating layer which is interposed between the substrate and the lower layer.

A variety of organic compounds can be used for formation of the undercoating layer. Examples of such organic compounds include carboxymethyl cellulose; dextrin; gum arabic; organic phosphonic acids such as amino group-containing phosphonic acid (e.g., 2-aminoethyl phosphonic acid), phenylphosphonic acid which may have a substituent, naphthylphosphonic acid, alkylphosphonic acid, glycerophosphonic acid, methylenediphosphonic acid, and ethylenediphosphonic acid; organic phosphoric acids such as phenylphosphoric acid which may have a substituent, naphthylphosphoric acid, alkylphosphoric acid, and glycerophosphoric acid; organic phosphinic acids such as phenylphosphinic acid which may have a substituent, naphthylphosphinic acid, alkylphosphinic acid and glycerophosphinic acid; amino acids such as glycine and β-alanine; and hydrochlorides of hydroxyl group-containing amine, such as hydrochloride of triethanolamine. Those compounds may be used in combination.

The organic undercoating layer can be provided by the following methods. The above-mentioned organic compound is dissolved in water or organic solvents such as methanol, ethanol, and methyl ethyl ketone, or a mixture of such solvents to prepare a coating liquid for forming the undercoating layer. The coating liquid thus prepared is coated on the aluminum plate and then dried, so that an undercoating layer can be provided on the aluminum substrate. Alternatively, an aluminum plate is immersed in the solution prepared by dissolving the above-mentioned organic compound in water or organic solvents such as methanol, ethanol, and methyl ethyl ketone, or a mixture of such solvents to cause the aluminum plate to absorb the compound. Thereafter, the coated surface is washed with water and dried, thereby obtaining an organic undercoating layer on the aluminum substrate. In the former method for providing the undercoating layer, the coating liquid containing the above-mentioned organic compound at concentrations ranging from 0.005 to 10% by weight can be applied to a variety of coating methods. In the latter method, the concentration of the organic compound in the coating liquid is preferably in the range of 0.01 to 20% by weight, more preferably in the range of 0.05 to 5% by weight. The aluminum plate may be immersed in the solution of 20 to 90° C., preferably 25 to 50° C., for 0.1 sec to 20 min, preferably 2 sec to 1 min. The coating liquid used to form the undercoating layer may be controlled to pH 1 to 12 by the addition of basic materials such as ammonia, triethylamine, potassium hydroxide and the like, or acidic materials such as hydrochloric acid, phosphoric acid and the like. Furthermore, the coating liquid for the undercoating layer may further comprise a yellow dye to improve the tone reproduction of the image forming layer to be formed on the undercoating layer.

It is proper that the deposition amount of the undercoating layer be in the range of 2 to 200 mg/m$^2$ from the aspect of sufficient printing durability, and preferably in the range of 5 to 100 mg/m$^2$.

The heat-sensitive PS plate for lithographic printing thus fabricated is exposed to light images and thereafter subjected to development using the previously mentioned alkaline developing solution.

The light source capable of emitting the active light for achieving the light exposure includes, for example, mercury lamp, metal halide lamp, xenon lamp, chemical lamp, and carbon arc lamp. The radiation includes electron beam, X-ray, ion beam, and far infrared ray, and the like. Further, g-line, i-line, deep-UV and high-density energy beam (laser beam) are also used. The laser beam includes helium-neon laser, argon laser, krypton laser, helium-cadmium laser, KrF excimer laser, and the like. In the present invention, the light sources for emitting the light of wavelengths within the range from the near infrared to infrared region are preferred. In particular, solid laser and semiconductor laser are preferable in the present invention.

After completion of the development, the PS plate is subjected to water washing and/or rinsing and/or gumming up. In the case where the resultant PS plate bears an image portion that needs deleting, such as an edge portion of the original film, the unnecessary image portion may be deleted by, for example, applying a correction fluid as described in JP KOKOKU No. Hei 2-13293 to the unnecessary image portion and washing the portion with water after a predetermined period of time. Although the above-mentioned method is preferable, another method as described in JP KOKAI No. Sho 59-174842 can also be employed, by which method the active light guided along an optical fiber is applied to the unnecessary image portion, followed by development.

The lithographic printing plate can thus be prepared according to the method of the present invention. A desensitizing gum may be coated on the printing plate, if necessary, before printing operation. When the printing plate is required to have higher printing durability, the printing plate may be subjected to a burning treatment. In this case, it is desirable to treat the printing plate with a liquid for counteretching as described in JP KOKOKU Nos. Sho 61-2518 and 55-28062, and JP KOKAI Nos. Sho 62-31859 and 61-159655 prior to the burning treatment.

For the treatment of the printing plate with a counter-etch solution, the counter-etch solution may be coated on the printing plate using a sponge or absorbent cotton dampened with the counter-etch solution, or the printing plate may be immersed in the counter-etch solution held in a vat. Further, an automatic coater may be used. After completion of the coating, the coating amount may be made uniform by using a squeegee or squeezing roller to produce more favorable results.

It is proper that the counter-etch solution be coated on the printing plate in a coating amount of 0.03 to 0.8 g/m$^2$ on a dry basis. The printing plate thus coated with the counter-etch solution is dried, and thereafter heated to high temperatures in a burning processor such as a commercially available burning processor "BP-1300" made by Fuji Photo Film Co., Ltd., if necessary. In this case, the heating temperature and the heating time, which vary depending upon the kinds of components constituting the image portion of the printing plate, may preferably be controlled within the range of 180 to 300° C. and 1 to 20 minutes, respectively.

After the burning treatment, the printing plate may appropriately be subjected to the conventional treatments such as water washing, gumming up and the like. When the printing plate has been treated with a counter-etch solution comprising a water-soluble polymer compound, the step of desensitization including gumming up may be omitted. The lithographic printing plate thus obtained can be set in an offset press to produce large numbers of printed matters.

Other features of this invention will become apparent in the course of the following description of exemplary embodiments, which are given for illustration of the invention and are not intended to be limiting thereof.

EXAMPLES

Preparation of Heat-sensitive PS Plate for Lithographic Printing

An aluminum plate of 0.3 mm thickness (grade 1050) was washed with trichloroethylene to be degreased, and surface-grained with a nylon brush and an aqueous suspension of 400 mesh pumice stone, and then sufficiently washed with water. The aluminum plate was then subjected to an immersion etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3 g/m$^2$. Then it was anodized in a 7% aqueous solution of sulfuric acid at a DC current density of 15 A/dm$^2$ so that the thickness of the resulting anodized layer was 3 g/m$^2$, washed with water, and then dried. Thereafter, the aluminum plate was treated with a 2.5% aqueous solution of sodium silicate at 30° C. for 10 seconds, coated with the following coating solution of undercoating layer, and dried under 80° C. for 15 seconds to obtain a substrate. The coated amount of the undercoating layer after drying was 15 mg/m$^2$.

| <Coating Solution of Undercoating Layer> | |
|---|---|
| Copolymer P (molecular weight: 28,000) represented by the formula below | 0.3 g |
| Methanol | 100 g |
| Water | 1 g |

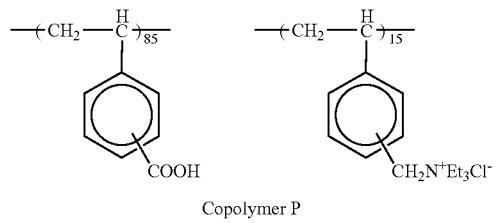

Copolymer P

Synthesis Example 1

Synthesis of Component (B1): Alkali-Soluble Polymer having Carboxyl Group

To a 20 ml volume three-necked flask equipped with a stirring machine, a cooling tube and a dropping funnel, there were added 6.39 g (0.045 mole) of n-propyl methacrylate, 1.29 g (0.015 mole) of methacrylic acid and 20 g of 1-methoxy-2-propanol and then the resulting mixture was stirred while heating it at 65° C. in a hot water bath. To this mixture, there was added 0.15 g of "V-601" (available from WAKO Pure Chemical Co., Ltd.) and then the mixture was stirred in a nitrogen gas stream for 2 hours while retaining the same at 70° C. To this reaction mixture, there was further dropwise added a mixture comprising 6.39 g (0.045 mole) of n-propyl methacrylate, 1.29 g (0.015 mole ) of methacrylic acid, 20 g of 1-methoxy-2-propanol and 0.15 of "V-601" through a dropping funnel over 2 hours. After the dropwise addition of the mixture, the resulting mixture was additionally stirred at 90° C. for 2 hours. After the completion of the reaction, 40 g of methanol was added to the reaction mixture, followed by cooling the mixture, introduction of the resulting mixture into 2 L of water while stirring the water, stirring the mixture over 30 minutes, filtration of the reaction mixture to remove precipitates thus formed, and then drying the precipitates to give 15 g of a white solid. The weight-average molecular weight (polystyrene standard) of the copolymer was determined by the gel permeation chromatography and it was found to be 53,000.

Synthesis Example 2

Synthesis of Component (B1): Alkali-Soluble having Carboxyl Group

According to the same procedure as in Synthesis Example 1, ethyl methacrylate/isobutyl methacrylate/methacrylic acid (mol %: 35/35/30) were used to synthesize a copolymer. The weight-average molecular weight (polystyrene standard) of the copolymer was determined by the gel permeation chromatography and it was found to be 50,000.

Synthesis Example 3

Synthesis of Component (B1): Polyurethane Resin having Carboxyl Group

To a 500 ml volume three-necked round-bottom flask equipped with a cooler, there were added 14.6 g (0.109 mole) of 2,2-bis(hydroxymethyl)propionic acid, 13.3 g (0.0686 mole) of tetraethylene glycol and 2.05 g (0.0228 mole) of 1,4-butane diol, and then the mixture was dissolved in 118 g of N,N-dimethylacetamide. To this mixture, 30.8 g (0.123 mole) of 4,4'-diphenylmethane diisocyanate, 13.8 g (0.0819 mole) of hexamethylene diisocyanate and 0.1 of dilauric acid di-n-butyl tin as a catalyst were added, and then the resulting mixture was heated at 90° C. for 7 hours while stirring it.

To the reaction liquid, there were added 100 ml of N,N-dimethylacetamide, 50 ml of methanol and 50 ml of acetic acid, and then the mixture was stirred, and said mixture was charged into 4 liter of water with stirring to precipitate a white polymer. This polymer was separated, washed with water, and then dried under reduced pressure to give 60 g of the polymer.

The weight-average molecular weight (polystyrene standard) of the polymer was determined by the gel permeation chromatography and it was found to be 70,000. The content of carboxyl groups in the polymer was determined by titration and it was found to be 1.43 meq/g.

Synthesis Example 4

Synthesis of Component (B1): Polyurethane Resin having Carboxyl Group

According to the same procedure as in Synthesis Example 3, the following diisocyanate compounds (mole %):

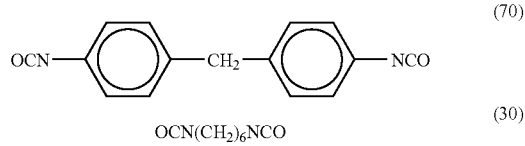

(70)

OCN(CH$_2$)$_6$NCO (30)

and the following diol compounds (mole %):

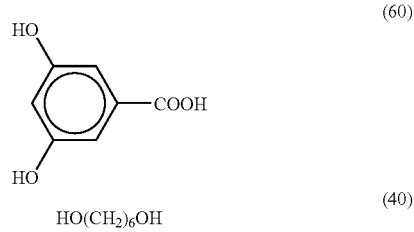

(60)

HO(CH$_2$)$_6$OH (40)

were used to synthesize a copolymer. The content of acids in the polymer was found to be 1.72 meq/g, and the weight-average molecular weight (polystyrene standard) of the copolymer was found to be 80,000.

On the aluminum substrate thus obtained, the following photosensitive solution 1 was applied in amount of 0.85 g/m² (weighed after drying) through a wire bar, and dried by using Perfect Over PH200 manufactured by TABAI Co. under a wind control of 7, at a temperature of 140° C. for 50 seconds. Further, the following photosensitive solution 2 was applied thereon in amount of 0.2 g/m² (weighed after drying) through a wire bar, and then dried by using Perfect Over PH200 manufactured by TABAI Co. under wind control of 7, at a temperature of 120° C. for 60 seconds to obtain a PS plate having a heat-sensitive layer consisting of two-layered structure.

<Photosensitive Solution 1>

| | |
|---|---|
| Copolymer of Synthesis Example 2 | 0.050 g |
| Copolymer of Synthesis Example 4 | 0.050 g |
| N-(4-Aminosurfonylphenyl)methacrylamide/acrylonitrile/methyl methacrylate (36/34/30, weight-average molecular weight of 50,000) | 1.896 g |
| Cresol novolac (m/p ratio = 6/4, weight-average molecular weight of 4,500, comprising 0.8% by weight of unreacted monomer) | 0.237 g |
| Cyanine dye A | 0.109 g |
| 4,4'-Bishydroxyphenylsulfone | 0.063 g |
| Tetrahydrophthalic anhydride | 0.190 g |
| P-toluene sulfonic acid | 0.008 g |
| Ethylviolet (counter ion: 6-hydroxy-β-naphthalene sulfonic acid) | 0.05 g |
| Fluorine atom-containing surfactant (trade name of F-176 manufactured by Dainippon Ink and Chemicals, Inc.) | 0.035 g |
| Methyl ethyl ketone | 26.6 g |
| 1-Methoxy-2-propanol | 13.6 g |
| γ-butyrolactone | 13.8 g |

Cyanine Dye A:

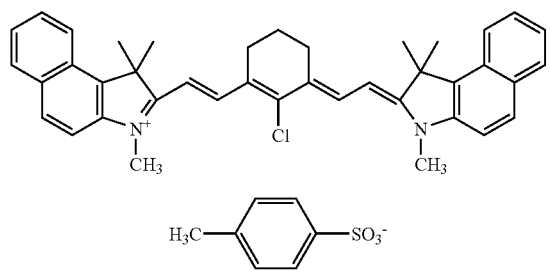

<Photosensitive Solution 2>

| | |
|---|---|
| Copolymer of Synthesis Example 2 | 0.050 g |
| Copolymer of Synthesis Example 4 | 0.050 g |
| Cresol novolac (m/p ratio = 6/4, weight-average molecular weight of 4,500, comprising 0.8% by weight of unreacted monomer) | 0.237 g |
| Cyanine dye A | 0.047 g |
| Dodecyl stearate | 0.060 g |
| 3-Methoxy-4-diazodiphenylamine hexafluorophosphate | 0.030 g |
| Fluorine atom-containing surfactant (trade name of F-176 (20% solution) manufactured by Dainippon Ink and Chemicals, Inc.) | 0.110 g |
| Fluorine atom-containing surfactant (trade name of MCF312F (30% solution) manufactured by Dainippon Ink and Chemicals, Inc.) | 0.12 g |
| Methyl ethyl ketone | 15.1 g |
| 1-Methoxy-2-propanol | 7.7 g |

<Preparation of Developing Solutions>

[Preparation of SiO$_2$-containing Alkaline Developing Solution]

SiO$_2$-containing alkaline developing solutions were prepared as follows. Diverse cationic surfactants (a) to (aa) shown below, and diverse ethylene oxide adducts (A) to (F) (above mentioned), each was added at various concentrations summarized in the following Tables 1–3 to one litter of an aqueous solution comprising 4.0% by weight of potassium salt whose molar ratio of SiO$_2$/K$_2$O was 1.1 to obtain developing solutions (1) to (80). For comparison, the above aqueous solution comprising 4.0% by weight of potassium salt whose molar ratio of SiO$_2$/K$_2$O was 1.1 was referred to as developing solution (i), a developing solution (ii) was prepared by adding polyethylene glycol 1000 to the above aqueous solution, and a developing solution (iii) was prepared by adding polyethylene glycol 1500 to the above aqueous solution, instead of the cationic surfactant or the ethylene oxide adduct.

[Preparation of Nonreducing Sugar Containing Alkaline Developing Solution]

Nonreducing sugar-containing alkaline developing solutions were prepared as follows. Diverse cationic surfactants (a) to (aa) shown below, and diverse ethylene oxide adducts (A) to (F) (above mentioned), each was added at various concentrations summarized in the following Tables 1–3 to one litter of an aqueous solution comprising 5.0% by weight of potassium salt consisting of a combination of a nonreducing sugar and a base: D-sorbitol/potassium oxide K$_2$O to obtain developing solutions (81) to (160). For comparison, the above aqueous solution comprising 5.0% by weight of potassium salt consisting of a combination of a nonreducing sugar and a base: D-sorbitol/potassium oxide K$_2$O was referred to developing solution (iv), a developing solution (v) was prepared by adding polyethylene glycol 1000 to the above aqueous solution, and a developing solution (vi) was prepared by adding polyethylene glycol 1500 to the above aqueous solution, instead of the cationic surfactant or the ethylene oxide adduct.

(Cationic Surfactants)

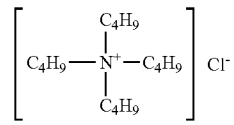 (a)

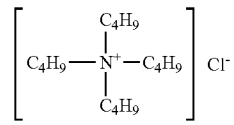 (b)

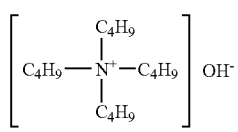 (c)

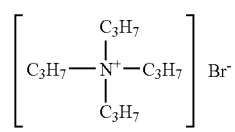 (d)

-continued
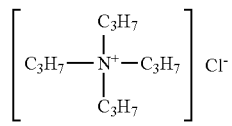 (e)
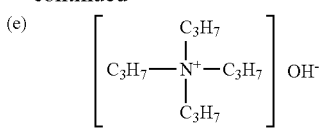 (f)
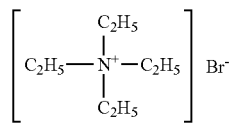 (g)
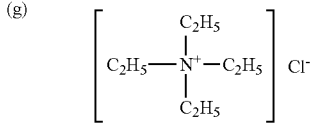 (h)
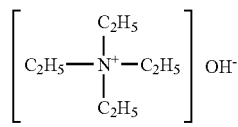 (i)
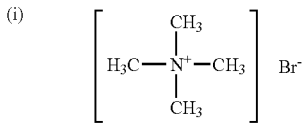 (j)
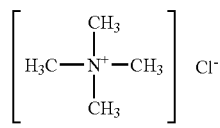 (k)
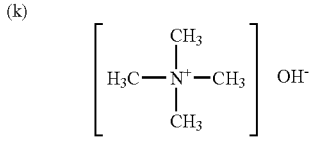 (l)
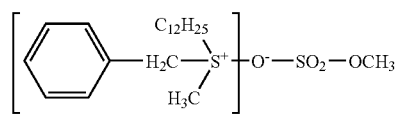 (m)
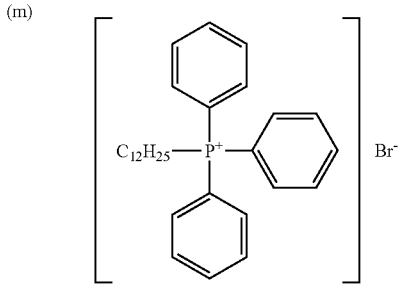 (n)
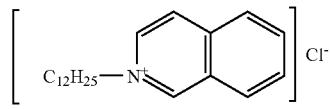 (o)
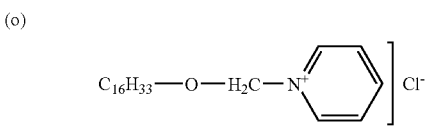 (p)
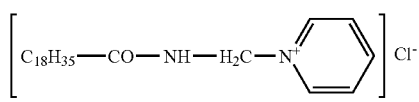 (q)
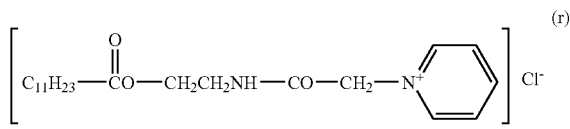 (r)
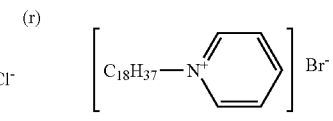 (s)
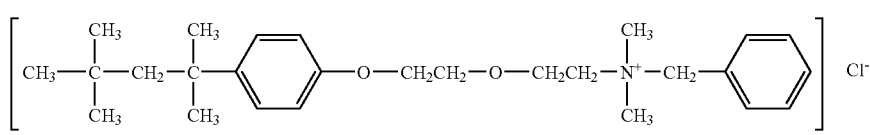 (t)
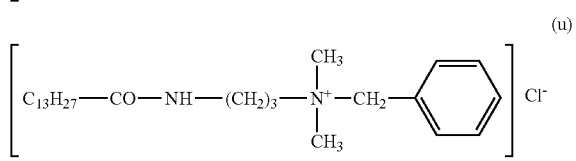 (u)
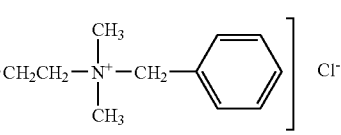 (v)
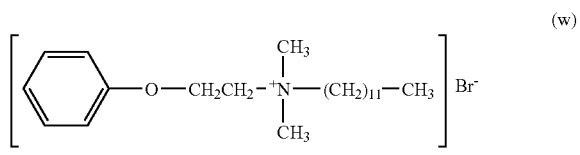 (w)
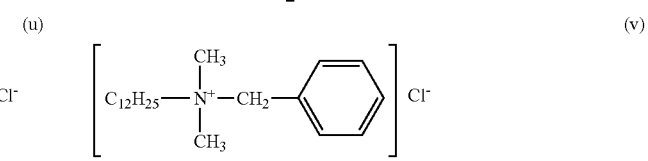 (x)

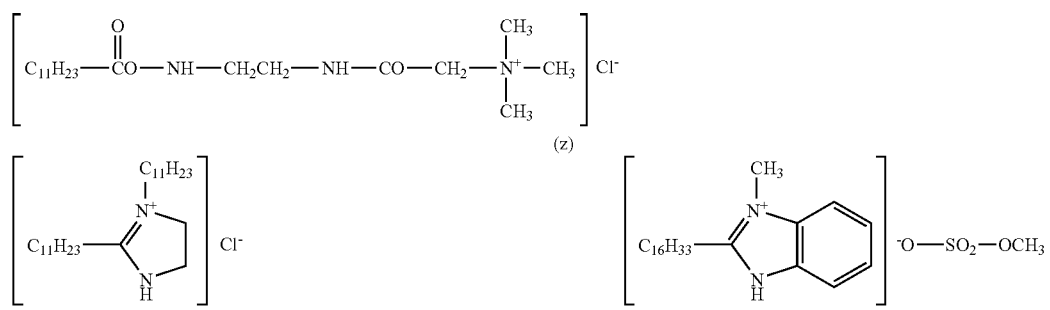

TABLE 1

| SiO$_2$-containing Developing Solution No. | Nonreducing sugar-containing Developing Solution No. | Cationic Surfactant | g/liter | Ethylene Oxide Adduct | the number of EO in the molecule (mol) | g/liter |
|---|---|---|---|---|---|---|
| (1) | (81) | (a) | 0.01 | — | — | — |
| (2) | (82) | (a) | 0.1 | — | — | — |
| (3) | (83) | (a) | 1.0 | — | — | — |
| (4) | (84) | (a) | 10.0 | — | — | — |
| (5) | (85) | (b) | 0.1 | — | — | — |
| (6) | (86) | (c) | 0.1 | — | — | — |
| (7) | (87) | (d) | 0.1 | — | — | — |
| (8) | (88) | (e) | 0.1 | — | — | — |
| (9) | (89) | (f) | 0.1 | — | — | — |
| (10) | (90) | (g) | 0.1 | — | — | — |
| (11) | (91) | (h) | 0.1 | — | — | — |
| (12) | (92) | (i) | 0.1 | — | — | — |
| (13) | (93) | (j) | 0.1 | — | — | — |
| (14) | (94) | (k) | 0.1 | — | — | — |
| (15) | (95) | (l) | 0.1 | — | — | — |
| (16) | (96) | (m) | 0.1 | — | — | — |
| (17) | (97) | (n) | 0.1 | — | — | — |
| (18) | (98) | (o) | 0.1 | — | — | — |
| (19) | (99) | (p) | 0.1 | — | — | — |
| (20) | (100) | (q) | 0.1 | — | — | — |
| (21) | (101) | (r) | 0.1 | — | — | — |
| (22) | (102) | (s) | 0.1 | — | — | — |
| (23) | (103) | (t) | 0.1 | — | — | — |
| (24) | (104) | (u) | 0.1 | — | — | — |
| (25) | (105) | (v) | 0.1 | — | — | — |
| (26) | (106) | (w) | 0.1 | — | — | — |
| (27) | (107) | (x) | 0.1 | — | — | — |
| (28) | (108) | (y) | 0.1 | — | — | — |
| (29) | (109) | (z) | 0.1 | — | — | — |
| (30) | (110) | (aa) | 0.1 | — | — | — |

TABLE 2

| SiO$_2$-containing Developing Solution No. | Nonreducing sugar-containing Developing Solution No. | Cationic Surfactant | g/liter | Ethylene Oxide Adduct | the number of EO in the molecule (mol) | g/liter |
|---|---|---|---|---|---|---|
| (31) | (111) | — | — | (A) | 10 | 1.0 |
| (32) | (112) | — | — | (A) | 20 | 1.0 |
| (33) | (113) | — | — | (A) | 30 | 1.0 |
| (34) | (114) | — | — | (A) | 40 | 1.0 |
| (35) | (115) | — | — | (A) | 60 | 1.0 |
| (36) | (116) | — | — | (A) | 80 | 1.0 |
| (37) | (117) | — | — | (A) | 100 | 1.0 |
| (38) | (118) | — | — | (B) | 10 | 1.0 |
| (39) | (119) | — | — | (B) | 20 | 1.0 |
| (40) | (120) | — | — | (B) | 30 | 1.0 |
| (41) | (121) | — | — | (B) | 40 | 1.0 |
| (42) | (122) | — | — | (B) | 60 | 1.0 |
| (43) | (123) | — | — | (B) | 80 | 1.0 |
| (44) | (124) | — | — | (B) | 100 | 1.0 |
| (45) | (125) | — | — | (C) | 10 | 1.0 |
| (46) | (126) | — | — | (C) | 20 | 1.0 |
| (47) | (127) | — | — | (C) | 30 | 0.01 |
| (48) | (128) | — | — | (C) | 30 | 0.1 |
| (49) | (129) | — | — | (C) | 30 | 1.0 |
| (50) | (130) | — | — | (C) | 30 | 10.0 |
| (51) | (131) | — | — | (C) | 30 | 100.0 |
| (52) | (132) | — | — | (C) | 40 | 1.0 |
| (53) | (133) | — | — | (C) | 60 | 1.0 |
| (54) | (134) | — | — | (C) | 80 | 1.0 |
| (55) | (135) | — | — | (C) | 100 | 1.0 |
| (56) | (136) | — | — | (D) | 10 | 1.0 |
| (57) | (137) | — | — | (D) | 20 | 1.0 |
| (58) | (138) | — | — | (D) | 30 | 1.0 |
| (59) | (139) | — | — | (D) | 40 | 1.0 |
| (60) | (140) | — | — | (D) | 60 | 1.0 |

TABLE 3

| SiO$_2$-containing Developing Solution No. | Nonreducing sugar-containing Developing Solution No. | Cationic Surfactant | g/liter | Ethylene Oxide Adduct | the number of EO in the molecule (mol) | g/liter |
|---|---|---|---|---|---|---|
| (61) | (141) | — | — | (D) | 80 | 1.0 |
| (62) | (142) | — | — | (D) | 100 | 1.0 |
| (63) | (143) | — | — | (E) | 10 | 1.0 |
| (64) | (144) | — | — | (E) | 20 | 1.0 |
| (65) | (145) | — | — | (E) | 30 | 1.0 |
| (66) | (146) | — | — | (E) | 40 | 1.0 |
| (67) | (147) | — | — | (E) | 60 | 1.0 |
| (68) | (148) | — | — | (E) | 80 | 1.0 |

TABLE 3-continued

| SiO₂-containing Developing Solution No. | Nonreducing sugar-containing Developing Solution No. | Cationic Surfactant g/liter | Ethylene Oxide Adduct | the number of EO in the molecule (mol) | g/liter |
|---|---|---|---|---|---|
| (69) | (149) | — — | (E) | 100 | 1.0 |
| (70) | (150) | — — | (F) | 10 | 1.0 |
| (71) | (151) | — — | (F) | 20 | 1.0 |
| (72) | (152) | — — | (F) | 30 | 0.01 |
| (73) | (153) | — — | (F) | 30 | 0.1 |
| (74) | (154) | — — | (F) | 30 | 1.0 |
| (75) | (155) | — — | (F) | 30 | 10.0 |
| (76) | (156) | — — | (F) | 30 | 100.0 |
| (77) | (157) | — — | (F) | 40 | 1.0 |
| (78) | (158) | — — | (F) | 60 | 1.0 |
| (79) | (159) | — — | (F) | 80 | 1.0 |
| (80) | (160) | — — | (F) | 100 | 1.0 |
| (i) | (iv) | — — | — | — | — |
| (ii) | (v) | polyethylene glycol 1000 (EO 20) | | | 1.0 |
| (iii) | (vi) | polyethylene glycol 1500 (EO 35) | | | 1.0 |

The above obtained PS plate was light-exposed using a semiconductor laser with an output power of 500 mW, a wave length of 830 nm and a beam diameter of 17 μm(1/e²) at a horizontal scanning speed of 5 m/sec, and maintained at 25° C.

The PS plate thus treated was processed by an automatic processor, PS900NP (manufactured by Fuji Photo Film Co., Ltd.) filled up with the above each developing solution, at a development temperature of 25° C., 30° C., or 35° C. for 12 seconds. After the development procedure, the plate was washed with water and treated with a gum solution (two-fold dilution of GU-7 manufactured by Fuji Photo Film Co., Ltd.) so as to obtain a lithographic printing plate. The lithographic printing plate thus obtained was evaluated as follows.

<Evaluation on Balance of Image Area/Non-image Area>

[Evaluation on Development of Non-image Area]

Development effect on the non-image areas of the above lithographic printing plate was visually determined by observing undissolved residue on non-image areas. In addition, toning on a printed matter was also evaluated. The results were shown in Tables 4–9.

Criteria:
○: The non-image areas were sufficiently developed and there was observed no residue of the lower layer of image-forming layer on the non-image areas. Toning on the printed matter was not observed.
Δ: The lower layer of image-forming layer was left slightly on the non-image areas. Toning on the printed matter was not observed.
×: Failure of development was observed, and the lower layer of image-forming layer was left on the non-image areas. Toning on the printed matter was observed.

[Evaluation of Impairment of Image Area]

Impairment of the image areas of the above lithographic printing plate was visually determined. The results were shown in Tables 4–9.

Criteria:
○: There was observed no impairment in the upper layer of the image areas. The image density was 90% or more of the density of the non-exposed portion. Color defect of the image areas on the printed matter was not observed.
Δ: Image density was from 70% to less than 90% of the density of the non-exposed portion, and part of the upper layer of the image area was slightly damaged. Color defect of the image areas on the printed matter was not observed.
×: Image density was less than 70% of the density of the non-exposed portion, and there was observed damaged part of the upper layer of the image area. Color defect of the image areas on the printed matter was observed.

TABLE 4

| Example No. | Developing Solution No. | Development of Non-Image Area Development Temperature | | | Impairment of Image Area Development Temperature | | |
|---|---|---|---|---|---|---|---|
| | | 25° C. | 30° C. | 35° C. | 25° C. | 30° C. | 35° C. |
| 1 | (1) | ○ | ○ | ○ | ○ | ○ | ○ |
| 2 | (2) | ○ | ○ | ○ | ○ | ○ | ○ |
| 3 | (3) | ○ | ○ | ○ | ○ | ○ | ○ |
| 4 | (4) | ○ | ○ | ○ | ○ | ○ | ○ |
| 5 | (5) | ○ | ○ | ○ | ○ | ○ | ○ |
| 6 | (6) | ○ | ○ | ○ | ○ | ○ | ○ |
| 7 | (7) | ○ | ○ | ○ | ○ | ○ | ○ |
| 8 | (8) | ○ | ○ | ○ | ○ | ○ | ○ |
| 9 | (9) | ○ | ○ | ○ | ○ | ○ | ○ |
| 10 | (10) | ○ | ○ | ○ | ○ | ○ | ○ |
| 11 | (11) | ○ | ○ | ○ | ○ | ○ | ○ |
| 12 | (12) | ○ | ○ | ○ | ○ | ○ | ○ |
| 13 | (13) | ○ | ○ | ○ | ○ | ○ | ○ |
| 14 | (14) | ○ | ○ | ○ | ○ | ○ | ○ |
| 15 | (15) | ○ | ○ | ○ | ○ | ○ | ○ |
| 16 | (16) | ○ | ○ | ○ | ○ | ○ | ○ |
| 17 | (17) | ○ | ○ | ○ | ○ | ○ | ○ |
| 18 | (18) | ○ | ○ | ○ | ○ | ○ | ○ |
| 19 | (19) | ○ | ○ | ○ | ○ | ○ | ○ |
| 20 | (20) | ○ | ○ | ○ | ○ | ○ | ○ |
| 21 | (21) | ○ | ○ | ○ | ○ | ○ | ○ |
| 22 | (22) | ○ | ○ | ○ | ○ | ○ | ○ |
| 23 | (23) | ○ | ○ | ○ | ○ | ○ | ○ |
| 24 | (24) | ○ | ○ | ○ | ○ | ○ | ○ |
| 25 | (25) | ○ | ○ | ○ | ○ | ○ | ○ |
| 26 | (26) | ○ | ○ | ○ | ○ | ○ | ○ |
| 27 | (27) | ○ | ○ | ○ | ○ | ○ | ○ |
| 28 | (28) | ○ | ○ | ○ | ○ | ○ | ○ |
| 29 | (29) | ○ | ○ | ○ | ○ | ○ | ○ |
| 30 | (30) | ○ | ○ | ○ | ○ | ○ | ○ |

TABLE 5

| Example No. | Developing Solution No. | Development of Non-Image Area Development Temperature | | | Impairment of Image Area Development Temperature | | |
|---|---|---|---|---|---|---|---|
| | | 25° C. | 30° C. | 35° C. | 25° C. | 30° C. | 35° C. |
| 31 | (31) | ○ | ○ | ○ | ○ | ○ | ○ |
| 32 | (32) | ○ | ○ | ○ | ○ | ○ | ○ |
| 33 | (33) | ○ | ○ | ○ | ○ | ○ | ○ |
| 34 | (34) | ○ | ○ | ○ | ○ | ○ | ○ |
| 35 | (35) | ○ | ○ | ○ | ○ | ○ | ○ |
| 36 | (36) | ○ | ○ | ○ | ○ | ○ | ○ |
| 37 | (37) | ○ | ○ | ○ | ○ | ○ | ○ |
| 38 | (38) | ○ | ○ | ○ | ○ | ○ | ○ |
| 39 | (39) | ○ | ○ | ○ | ○ | ○ | ○ |
| 40 | (40) | ○ | ○ | ○ | ○ | ○ | ○ |
| 41 | (41) | ○ | ○ | ○ | ○ | ○ | ○ |
| 42 | (42) | ○ | ○ | ○ | ○ | ○ | ○ |
| 43 | (43) | ○ | ○ | ○ | ○ | ○ | ○ |
| 44 | (44) | ○ | ○ | ○ | ○ | ○ | ○ |
| 45 | (45) | ○ | ○ | ○ | ○ | ○ | ○ |
| 46 | (46) | ○ | ○ | ○ | ○ | ○ | ○ |
| 47 | (47) | ○ | ○ | ○ | ○ | ○ | ○ |
| 48 | (48) | ○ | ○ | ○ | ○ | ○ | ○ |
| 49 | (49) | ○ | ○ | ○ | ○ | ○ | ○ |
| 50 | (50) | ○ | ○ | ○ | ○ | ○ | ○ |

TABLE 5-continued

| Example No. | Developing Solution No. | Development of Non-Image Area Development Temperature | | | Impairment of Image Area Development Temperature | | |
|---|---|---|---|---|---|---|---|
| | | 25° C. | 30° C. | 35° C. | 25° C. | 30° C. | 35° C. |
| 51 | (51) | ○ | ○ | ○ | ○ | ○ | ○ |
| 52 | (52) | ○ | ○ | ○ | ○ | ○ | ○ |
| 53 | (53) | ○ | ○ | ○ | ○ | ○ | ○ |
| 54 | (54) | ○ | ○ | ○ | ○ | ○ | ○ |
| 55 | (55) | ○ | ○ | ○ | ○ | ○ | ○ |
| 56 | (56) | ○ | ○ | ○ | ○ | ○ | ○ |
| 57 | (57) | ○ | ○ | ○ | ○ | ○ | ○ |
| 58 | (58) | ○ | ○ | ○ | ○ | ○ | ○ |
| 59 | (59) | ○ | ○ | ○ | ○ | ○ | ○ |
| 60 | (60) | ○ | ○ | ○ | ○ | ○ | ○ |

TABLE 6

| Example No. | Developing Solution No. | Development of Non-Image Area Development Temperature | | | Impairment of Image Area Development Temperature | | |
|---|---|---|---|---|---|---|---|
| | | 25° C. | 30° C. | 35° C. | 25° C. | 30° C. | 35° C. |
| 61 | (61) | ○ | ○ | ○ | ○ | ○ | ○ |
| 62 | (62) | ○ | ○ | ○ | ○ | ○ | ○ |
| 63 | (63) | ○ | ○ | ○ | ○ | ○ | ○ |
| 64 | (64) | ○ | ○ | ○ | ○ | ○ | ○ |
| 65 | (65) | ○ | ○ | ○ | ○ | ○ | ○ |
| 66 | (66) | ○ | ○ | ○ | ○ | ○ | ○ |
| 67 | (67) | ○ | ○ | ○ | ○ | ○ | ○ |
| 68 | (68) | ○ | ○ | ○ | ○ | ○ | ○ |
| 69 | (69) | ○ | ○ | ○ | ○ | ○ | ○ |
| 70 | (70) | ○ | ○ | ○ | ○ | ○ | ○ |
| 71 | (71) | ○ | ○ | ○ | ○ | ○ | ○ |
| 72 | (72) | ○ | ○ | ○ | ○ | ○ | ○ |
| 73 | (73) | ○ | ○ | ○ | ○ | ○ | ○ |
| 74 | (74) | ○ | ○ | ○ | ○ | ○ | ○ |
| 75 | (75) | ○ | ○ | ○ | ○ | ○ | ○ |
| 76 | (76) | ○ | ○ | ○ | ○ | ○ | ○ |
| 77 | (77) | ○ | ○ | ○ | ○ | ○ | ○ |
| 78 | (78) | ○ | ○ | ○ | ○ | ○ | ○ |
| 79 | (79) | ○ | ○ | ○ | ○ | ○ | ○ |
| 80 | (80) | ○ | ○ | ○ | ○ | ○ | ○ |
| Comp. Ex. 1 | (i) | X | Δ | ○ | ○ | X | X |
| Comp. Ex. 2 | (ii) | X | Δ | ○ | ○ | Δ | X |
| Comp. Ex. 3 | (iii) | X | Δ | ○ | ○ | Δ | X |

TABLE 7

| Example No. | Developing Solution No. | Development of Non-Image Area Development Temperature | | | Impairment of Image Area Development Temperature | | |
|---|---|---|---|---|---|---|---|
| | | 25° C. | 30° C. | 35° C. | 25° C. | 30° C. | 35° C. |
| 81 | (81) | ○ | ○ | ○ | ○ | ○ | ○ |
| 82 | (82) | ○ | ○ | ○ | ○ | ○ | ○ |
| 83 | (83) | ○ | ○ | ○ | ○ | ○ | ○ |
| 84 | (84) | ○ | ○ | ○ | ○ | ○ | ○ |
| 85 | (85) | ○ | ○ | ○ | ○ | ○ | ○ |
| 86 | (86) | ○ | ○ | ○ | ○ | ○ | ○ |
| 87 | (87) | ○ | ○ | ○ | ○ | ○ | ○ |
| 88 | (88) | ○ | ○ | ○ | ○ | ○ | ○ |
| 89 | (89) | ○ | ○ | ○ | ○ | ○ | ○ |
| 90 | (90) | ○ | ○ | ○ | ○ | ○ | ○ |
| 91 | (91) | ○ | ○ | ○ | ○ | ○ | ○ |
| 92 | (92) | ○ | ○ | ○ | ○ | ○ | ○ |
| 93 | (93) | ○ | ○ | ○ | ○ | ○ | ○ |
| 94 | (94) | ○ | ○ | ○ | ○ | ○ | ○ |
| 95 | (95) | ○ | ○ | ○ | ○ | ○ | ○ |
| 96 | (96) | ○ | ○ | ○ | ○ | ○ | ○ |
| 97 | (97) | ○ | ○ | ○ | ○ | ○ | ○ |
| 98 | (98) | ○ | ○ | ○ | ○ | ○ | ○ |
| 99 | (99) | ○ | ○ | ○ | ○ | ○ | ○ |
| 100 | (100) | ○ | ○ | ○ | ○ | ○ | ○ |
| 101 | (101) | ○ | ○ | ○ | ○ | ○ | ○ |
| 102 | (102) | ○ | ○ | ○ | ○ | ○ | ○ |
| 103 | (103) | ○ | ○ | ○ | ○ | ○ | ○ |
| 104 | (104) | ○ | ○ | ○ | ○ | ○ | ○ |
| 105 | (105) | ○ | ○ | ○ | ○ | ○ | ○ |
| 106 | (106) | ○ | ○ | ○ | ○ | ○ | ○ |
| 107 | (107) | ○ | ○ | ○ | ○ | ○ | ○ |
| 108 | (108) | ○ | ○ | ○ | ○ | ○ | ○ |
| 109 | (109) | ○ | ○ | ○ | ○ | ○ | ○ |
| 110 | (110) | ○ | ○ | ○ | ○ | ○ | ○ |

TABLE 8

| Example No. | Developing Solution No. | Development of Non-Image Area Development Temperature | | | Impairment of Image Area Development Temperature | | |
|---|---|---|---|---|---|---|---|
| | | 25° C. | 30° C. | 35° C. | 25° C. | 30° C. | 35° C. |
| 111 | (111) | ○ | ○ | ○ | ○ | ○ | ○ |
| 112 | (112) | ○ | ○ | ○ | ○ | ○ | ○ |
| 113 | (113) | ○ | ○ | ○ | ○ | ○ | ○ |
| 114 | (114) | ○ | ○ | ○ | ○ | ○ | ○ |
| 115 | (115) | ○ | ○ | ○ | ○ | ○ | ○ |
| 116 | (116) | ○ | ○ | ○ | ○ | ○ | ○ |
| 117 | (117) | ○ | ○ | ○ | ○ | ○ | ○ |
| 118 | (118) | ○ | ○ | ○ | ○ | ○ | ○ |
| 119 | (119) | ○ | ○ | ○ | ○ | ○ | ○ |
| 120 | (120) | ○ | ○ | ○ | ○ | ○ | ○ |
| 121 | (121) | ○ | ○ | ○ | ○ | ○ | ○ |
| 122 | (122) | ○ | ○ | ○ | ○ | ○ | ○ |
| 123 | (123) | ○ | ○ | ○ | ○ | ○ | ○ |
| 124 | (124) | ○ | ○ | ○ | ○ | ○ | ○ |
| 125 | (125) | ○ | ○ | ○ | ○ | ○ | ○ |
| 126 | (126) | ○ | ○ | ○ | ○ | ○ | ○ |
| 127 | (127) | ○ | ○ | ○ | ○ | ○ | ○ |
| 128 | (128) | ○ | ○ | ○ | ○ | ○ | ○ |
| 129 | (129) | ○ | ○ | ○ | ○ | ○ | ○ |
| 130 | (130) | ○ | ○ | ○ | ○ | ○ | ○ |
| 131 | (131) | ○ | ○ | ○ | ○ | ○ | ○ |
| 132 | (132) | ○ | ○ | ○ | ○ | ○ | ○ |
| 133 | (133) | ○ | ○ | ○ | ○ | ○ | ○ |
| 134 | (134) | ○ | ○ | ○ | ○ | ○ | ○ |
| 135 | (135) | ○ | ○ | ○ | ○ | ○ | ○ |
| 136 | (136) | ○ | ○ | ○ | ○ | ○ | ○ |
| 137 | (137) | ○ | ○ | ○ | ○ | ○ | ○ |
| 138 | (138) | ○ | ○ | ○ | ○ | ○ | ○ |
| 139 | (139) | ○ | ○ | ○ | ○ | ○ | ○ |
| 140 | (140) | ○ | ○ | ○ | ○ | ○ | ○ |

TABLE 9

| Example No. | Developing Solution No. | Development of Non-Image Area Development Temperature | | | Impairment of Image Area Development Temperature | | |
|---|---|---|---|---|---|---|---|
| | | 25° C. | 30° C. | 35° C. | 25° C. | 30° C. | 35° C. |
| 141 | (141) | ○ | ○ | ○ | ○ | ○ | ○ |
| 142 | (142) | ○ | ○ | ○ | ○ | ○ | ○ |
| 143 | (143) | ○ | ○ | ○ | ○ | ○ | ○ |
| 144 | (144) | ○ | ○ | ○ | ○ | ○ | ○ |
| 145 | (145) | ○ | ○ | ○ | ○ | ○ | ○ |
| 146 | (146) | ○ | ○ | ○ | ○ | ○ | ○ |
| 147 | (147) | ○ | ○ | ○ | ○ | ○ | ○ |
| 148 | (148) | ○ | ○ | ○ | ○ | ○ | ○ |
| 149 | (149) | ○ | ○ | ○ | ○ | ○ | ○ |
| 150 | (150) | ○ | ○ | ○ | ○ | ○ | ○ |
| 151 | (151) | ○ | ○ | ○ | ○ | ○ | ○ |
| 152 | (152) | ○ | ○ | ○ | ○ | ○ | ○ |
| 153 | (153) | ○ | ○ | ○ | ○ | ○ | ○ |
| 154 | (154) | ○ | ○ | ○ | ○ | ○ | ○ |
| 155 | (155) | ○ | ○ | ○ | ○ | ○ | ○ |
| 156 | (156) | ○ | ○ | ○ | ○ | ○ | ○ |
| 157 | (157) | ○ | ○ | ○ | ○ | ○ | ○ |
| 158 | (158) | ○ | ○ | ○ | ○ | ○ | ○ |
| 159 | (159) | ○ | ○ | ○ | ○ | ○ | ○ |
| 160 | (160) | ○ | ○ | ○ | ○ | ○ | ○ |
| Comp. Ex. 4 | (iv) | X | Δ | ○ | ○ | X | X |
| Comp. Ex. 5 | (v) | X | Δ | ○ | ○ | Δ | X |
| Comp. Ex. 6 | (vi) | X | Δ | ○ | ○ | Δ | X |

According to the present invention, when a printing plate is made from the heat-sensitive PS plate of a positive-working mode for lithographic printing, which PS plate comprises a substrate and an image forming layer on the substrate, the image forming layer comprising a lower layer and an upper heat-sensitive layer which are successively formed on the substrate in this order, the lower layer comprising a water-insoluble and alkaline-soluble resin and the upper heat-sensitive layer comprising a water-insoluble and alkaline-soluble resin and an infrared absorption dye and exhibiting an elevated solubility with respect to alkaline aqueous solutions when heated, the use of a specific alkaline developing solution can achieve sufficient resistance of the image area of the upper layer to dissolution in the developing solution, and simultaneously sufficient dissolution on the light-exposed area of the upper layer and the lower layer in the developing solution, resulting in formation of highly sharp and clear images on a printing plate without damage.

What is claimed is:

1. A method of making a lithographic printing plate from a heat-sensitive pre-sensitized plate of a positive-working mode for lithographic printing comprising the steps of:
    exposing the heat-sensitive pre-sensitized plate to light, and
    developing the plate using an alkaline developing solution comprising at least one compound having three or more ethylene oxide-terminal groups in the molecule thereof, wherein the pre-sensitized plate comprises a substrate, a lower layer which comprises a water-insoluble and alkali-soluble resin, and an upper heat-sensitive layer which comprises a water-insoluble and alkali-soluble resin and an infrared absorption dye and exhibits an elevated solubility with respect to alkaline aqueous solutions when heated, said lower layer and said upper heat-sensitive layer being located on the substrate in this order.

2. The method of claim 1 wherein the developing solution comprises at least one cationic surfactant.

3. The method of claim 2 wherein the cationic surfactant is selected from amine salts, quaternary ammonium salts, phosphonium salts and sulfonium salts.

4. The method of claim 2 wherein the cationic surfactant is selected from primary amine salts, secondary amine salts, tertiary amine salts, modified amine salts, imidazoline amine salts, tetraalkyl quaternary ammonium salts, modified trialkyl quaternary ammonium salts, trialkyl benzyl quaternary ammonium salts, modified trialkyl benzyl quaternary ammonium salts, alkylpyridinium salts, modified alkylpyridinium salts, alkylquinolinium salts, imidazolinium salts and benzimidazolinium salts, alkylphosphonium salts and alkylsulfonium salts.

5. The method of claim 1 wherein the compound having three or more ethylene oxide-terminal groups in the molecule thereof has three or more ethylene oxide-terminal groups represented by the formula: —(CH$_2$CH$_2$O)zH (wherein z is an integer of 1 or more) in the molecule thereof.

6. The method of claim 1 wherein the compound having three or more ethylene oxide-terminal groups in the molecule thereof has in the molecular structure thereof, at least one group of the following formula (I) or (II):

$$—O—(CH_2CH_2O)_x—H \qquad (I)$$

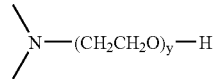

(II)

wherein x and y each represents an integer of 1 to 100.

7. The method of claim 1 wherein the compound having three or more ethylene oxide-terminal groups in the molecule thereof has in the molecular structure thereof, from three to twenty ethylene oxide-terminal groups.

8. The method of claim 7 wherein the compound having three or more ethylene oxide-terminal groups in the molecule thereof has in the molecular structure thereof, from three to ten ethylene oxide-terminal groups.

9. The method of claim 7 wherein the compound having three or more ethylene oxide-terminal groups in the molecule thereof has in the molecular structure thereof, from three to six ethylene oxide-terminal groups.

10. The method of claim 1 wherein the compound having three or more ethylene oxide-terminal groups in the molecule thereof has a molecular weight of from 500 to 5000.

11. The method of claim 1 wherein the compound having three or more ethylene oxide-terminal groups in the molecule thereof is selected from triethanolamine ethylene oxide adduct, trimethylolpropyl ether ethylene oxide adduct, ethylenediamine ethylene oxide adduct, diglyceryl ether ethylene oxide adduct, glycerol ethylene oxide adduct, and sorbitol ethylene oxide adduct.

12. The method of claim 2 wherein the amount of cationic surfactant in the developing solution is in the range of from 0.001 to 10% by weight.

13. The method of claim 1 wherein the amount of compound having three or more ethylene oxide-terminal groups in the molecule thereof in the developing solution is in the range of from 0.001 to 10% by weight.

14. The method of claim 1 wherein the water-insoluble and alkali-soluble resin in the upper heat-sensitive layer comprises a novolac resin and an alkali-soluble polymer having a carboxyl groups.

15. The method of claim 14 wherein the alkali-soluble polymer having a carboxyl group is selected from an alkali-soluble polymer having a polymerizable monomer unit represented by the following general formula (III)

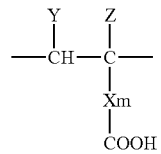
(III)

wherein Xm represents a single bond or a bivalent connecting group, Y represents hydrogen atom or a carboxyl group, and Z represents hydrogen atom, alkyl or carboxyl group, and an alkali-soluble polymer having a carboxyl group, which has as a basic skeleton, a reaction product of a diol compound having a carboxyl group represented by the following general formula (V), (VI) or (VII) and a diisocyanate compound represented by the following formula (X)

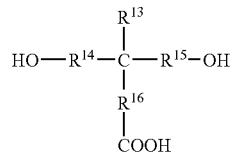
(V)

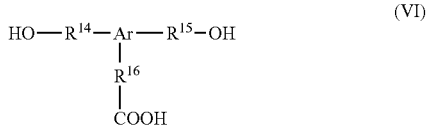
(VI)

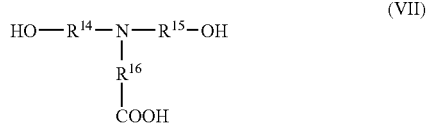
(VII)

wherein $R^{13}$ represents hydrogen atom, or an alkyl, alkenyl, aralkyl, aryl, alkoxy or aryloxy group which may have a substituent; $R^{14}$, $R^{15}$ and $R^{16}$, which may be the same or different, each represent a single bond, a bivalent aliphatic or aromatic hydrocarbon group which may have a substituent; two or three of $R^{13}$, $R^{14}$, $R^{15}$ and $R^{16}$ may form a ring together; Ar represents a trivalent aromatic hydrocarbon group which may have a substituent,

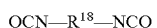
OCN—$R^{18}$—NCO (X)

wherein $R^{18}$ represents a bivalent aliphatic or aromatic hydrocarbon group which may have a substituent.

\* \* \* \* \*